US010938275B2

(12) United States Patent
Glatfelter et al.

(10) Patent No.: US 10,938,275 B2
(45) Date of Patent: Mar. 2, 2021

(54) ENERGY HARVESTING AIRPORT

(71) Applicant: The Boeing Company, Chicago, IL (US)

(72) Inventors: John W. Glatfelter, Kennett Square, PA (US); Stuart A. Galt, Maple Valley, WA (US)

(73) Assignee: The Boeing Company, Chicago, IL (US)

( * ) Notice: Subject to any disclaimer, the term of this patent is extended or adjusted under 35 U.S.C. 154(b) by 18 days.

(21) Appl. No.: 16/415,349

(22) Filed: May 17, 2019

(65) Prior Publication Data

US 2019/0280563 A1 Sep. 12, 2019

Related U.S. Application Data

(62) Division of application No. 15/425,542, filed on Feb. 6, 2017.

(51) Int. Cl.
*H02K 7/18* (2006.01)
*F03D 3/00* (2006.01)
(Continued)

(52) U.S. Cl.
CPC ............. *H02K 7/1823* (2013.01); *E01C 9/00* (2013.01); *F03D 3/002* (2013.01); *F03D 9/43* (2016.05);
(Continued)

(58) Field of Classification Search
CPC .. H02N 2/186; H02K 35/06; F05B 2240/9113
(Continued)

(56) References Cited

U.S. PATENT DOCUMENTS 3,017,146 A    10/1959   Wagner
4,262,210 A    4/1981   Yamine
(Continued)

FOREIGN PATENT DOCUMENTS

CA            2412225        6/2004
WO    WO-2016076891 A1 * 5/2016 ............. G01H 11/04

OTHER PUBLICATIONS

Engine Thrust Hazards in the Airport Environment http://www.boeing.com/commercial/aeromagazine/aero_06/textonly/s02txt.html.

*Primary Examiner* — Charles Reid, Jr.
(74) *Attorney, Agent, or Firm* — McDonnell Boehnen Hulbert & Berghoff LLP

(57) ABSTRACT

A system for harvesting energy from airport vehicle and passenger movements is described that includes a vehicular operating area with an operating surface, a pedestrian movement area with a walking surface, a first plurality of vibration panels positioned within the operating surface of the vehicular operating area, a second plurality of vibration panels positioned within the walking surface of the pedestrian movement area, and an electricity distribution grid. Each vibration panel in the first plurality of vibration panels and each vibration panel in the second plurality of vibration panels is a piezoelectric transducer, and each piezoelectric transducer is coupled to the electricity distribution grid such that electricity produced by each piezoelectric transducer in response to vibrations from vehicle or passenger movements is routed to the electricity distribution grid.

20 Claims, 24 Drawing Sheets

(51) Int. Cl.
    *E01C 9/00*     (2006.01)
    *H02N 2/18*     (2006.01)
    *H02K 35/06*     (2006.01)
    *F03D 9/43*     (2016.01)
    *H01L 41/113*     (2006.01)

(52) U.S. Cl.
    CPC ............ *H01L 41/113* (2013.01); *H02K 35/06* (2013.01); *H02N 2/186* (2013.01); *F05B 2220/706* (2013.01); *F05B 2240/221* (2013.01); *F05B 2240/9113* (2013.01); *Y02B 10/30* (2013.01); *Y02E 10/728* (2013.01); *Y02E 10/74* (2013.01)

(58) Field of Classification Search
    USPC ............................................ 290/1 R, 4 B, 50
    See application file for complete search history.

(56) References Cited

U.S. PATENT DOCUMENTS

| | | | |
|---|---|---|---|
| 5,998,882 | A | 12/1999 | Alston |
| 6,172,426 | B1 * | 1/2001 | Galich ................ F03G 7/08 290/1 R |
| 6,376,925 | B1 * | 4/2002 | Galich ................ F03G 7/08 290/1 R |
| 6,802,477 | B2 | 10/2004 | Campion |
| 7,380,751 | B1 | 6/2008 | Henson |
| 7,550,860 | B1 | 6/2009 | Blumenthal |
| 7,793,886 | B2 | 9/2010 | Henson, III |
| 9,080,551 | B2 | 7/2015 | Yudkovitz et al. |
| 9,359,997 | B2 | 6/2016 | Toh |
| 10,233,911 | B2 * | 3/2019 | Shani .................. F03G 5/06 |
| 2004/0130158 | A1 * | 7/2004 | Kenney ................ F03G 7/08 290/1 R |
| 2007/0085342 | A1 * | 4/2007 | Horianopoulos ......... F03G 7/08 290/1 R |
| 2008/0129446 | A1 | 6/2008 | Vader |
| 2008/0150286 | A1 | 6/2008 | Fein |
| 2008/0150288 | A1 | 6/2008 | Fein et al. |
| 2008/0224477 | A1 * | 9/2008 | Kenney ................ F03G 7/08 290/1 R |
| 2009/0250936 | A1 | 10/2009 | Souryai |
| 2009/0314169 | A1 | 12/2009 | Kachkovsky |
| 2010/0061853 | A1 | 3/2010 | Bagepalli |
| 2011/0018396 | A1 * | 1/2011 | Hayamizu ............. H02N 2/186 310/339 |
| 2013/0076033 | A1 * | 3/2013 | Zachary ............. F24D 11/0214 290/2 |
| 2013/0207520 | A1 * | 8/2013 | Near .................. H02N 2/186 310/339 |
| 2014/0007687 | A1 * | 1/2014 | Wang .................. G01P 3/02 73/584 |
| 2015/0243170 | A1 | 8/2015 | Collar |
| 2017/0057650 | A1 | 3/2017 | Walter-Robinson |
| 2018/0053889 | A1 * | 2/2018 | Ghanbari ............. H02N 2/181 |
| 2018/0226860 | A1 | 8/2018 | Glatfelter et al. |

\* cited by examiner

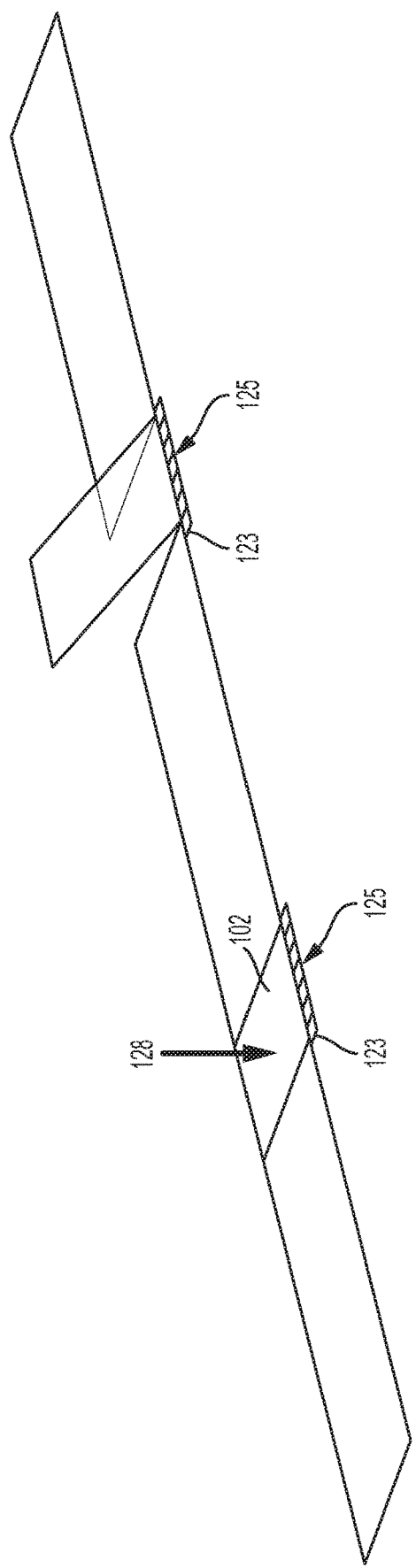

ENERGY HARVESTING AIRPORT

CROSS REFERENCE TO RELATED APPLICATION

The present disclosure claims priority to and is a divisional of U.S. application Ser. No. 15/425,542, filed on Feb. 6, 2017, the entire contents of which are herein incorporated by reference.

FIELD

The present disclosure generally relates to systems for harvesting energy in an airport environment.

BACKGROUND

There are many efforts presently to produce energy-efficient vehicles and systems within the transportation field, such as regenerative braking and hybrid engines. However, some energy expended during transportation operation is necessarily lost to the environment, and cannot be effectively recaptured by vehicle-borne systems. For example, in the air vehicle industry, energy is required for air vehicle takeoff operations. Generally, the energy expended during these takeoff operations dissipates, and is lost energy.

Further, many transportation environments involve the repetitive movement of vehicles. For example, in an airport environment, a number of relatively large vehicles, such as air vehicle, fueling trucks, baggage carts, tow trucks, maintenance vehicles, and the like are often channelized along the same paths. Again, the energy expended to move the vehicles from place to place is generally lost to the surrounding environment. The same is true with respect to passenger movements within the airport terminal, which may be both numerous and repetitive.

What are needed are systems that can harvest energy from transportation operations at the infrastructure level.

SUMMARY

In one example, a system for harvesting energy from air vehicle thrust operations is described including a runway surface for air vehicle takeoff and landing, where the runway surface comprises a door, and where the door is openable to a cavity positioned below the runway surface. The system also includes a plurality of wind turbine blades positioned within the cavity, where the plurality of wind turbine blades are rotatable by air flowing into the cavity. The system also includes a generator coupled to the plurality of wind turbine blades such that the generator produces electricity in response to the rotation of the plurality of wind turbine blades.

In another example, a method is described. The method includes opening a door in a runway surface for air vehicle takeoff and landing, where the door is openable to a cavity positioned below the runway surface. The method also includes rotating, via air vehicle exhaust air flowing into the cavity, a plurality of turbine blades positioned within the cavity. The method also includes producing, via a generator coupled to the plurality of wind turbine blades, electricity in response to the rotation of the plurality of wind turbine blades.

In another example, a system for harvesting energy from air vehicle thrust operations is described including a runway surface for air vehicle takeoff and landing, where the runway surface includes a blast fence extending from the runway surface. The blast fence includes a plurality of wind turbine blades, where the plurality of wind turbine blades are rotatable by air flowing toward the blast fence. The system also includes a generator coupled to the plurality of wind turbine blades such that the generator produces electricity in response to the rotation of the plurality of wind turbine blades.

In another example, a method is described. The method includes positioning a blast fence behind an air vehicle, where the blast fence includes a plurality of wind turbine blades. The method also includes rotating, via air vehicle engine exhaust air flowing toward the blast fence, the plurality of turbine blades. The method also includes producing, via a generator coupled to the plurality of wind turbine blades, electricity in response to the rotation of the plurality of wind turbine blades.

In another example, a system for harvesting energy from airport vehicle and passenger movements is described including a vehicular operating area where the vehicular operating area includes an operating surface. The system also includes a pedestrian movement area, where the pedestrian movement area includes a walking surface. The system also includes a first plurality of vibration panels positioned within the operating surface of the vehicle operating area. The system also includes a second plurality of vibration panels positioned within the walking surface of the pedestrian movement area, where each vibration panel in the first plurality of vibration panels and each vibration panel in the second plurality of vibration panels includes a piezoelectric transducer. The system also includes an electricity distribution grid, where each piezoelectric transducer is coupled to the electricity distribution grid such that electricity produced by each piezoelectric transducer in response to vibrations from vehicle or passenger movements is routed to the electricity distribution grid.

In another example, a method is described. The method includes detecting, via a first plurality of vibration panels positioned within an operating surface of a vehicular operating area of an airport, vibrations caused by vehicle movements. The method also includes detecting, via a second plurality of vibration panels positioned within a walking surface of a pedestrian movement area of the airport, vibrations caused by pedestrian movements, where each vibration panel in the first plurality of vibration panels and each vibration panel in the second plurality of vibration panels includes a piezoelectric transducer. The method also includes producing, via the piezoelectric transducers, electricity in response to the detected vibrations and routing the produced electricity to an electricity distribution grid.

In another example, a non-transitory computer readable medium is described. The non-transitory computer readable medium has instructions stored thereon, that when executed by a computing device, cause the computing device to perform functions including detecting, via one or more vibration panels coupled to the computing device and positioned within an airport runway surface, vibrations caused by a landing operation of an air vehicle, where the one or more vibration panels includes a piezoelectric transducer. The functions also include determining, based on the detected vibrations caused by the landing operation of the air vehicle, a position of the air vehicle with respect to the runway surface.

In another example, a system for harvesting energy from airport vehicle movements is described including a vehicular operating area, where the vehicular operating area includes an operating surface. The system also includes a plurality of induction loops positioned within the operating surface of the vehicular operating area. The system also includes an electricity distribution grid, where the plurality of induction loops is coupled to the electricity distribution grid such that electricity produced by the plurality of induction loops in response to vehicle movements over the operating surface of the vehicular operating area is routed to the electricity distribution grid.

In yet another example, a method is described. The method includes detecting, via a plurality of induction loops positioned within the operating surface of a vehicular operating area of an airport, movements of vehicles over the plurality of induction loops. The method also includes producing, via the plurality of induction loops, electricity in response to the detected vehicle movements. The method also includes routing the produced electricity to an electricity distribution grid.

The features, functions, and advantages that have been discussed can be achieved independently in various embodiments or may be combined in yet other embodiments, further details of which can be seen with reference to the following description and drawings.

BRIEF DESCRIPTION OF THE FIGURES

The novel features believed characteristic of the illustrative embodiments are set forth in the appended claims. The illustrative embodiments, however, as well as a preferred mode of use, further objectives and descriptions thereof, will best be understood by reference to the following detailed description of an illustrative embodiment of the present disclosure when read in conjunction with the accompanying Figures.

FIG. 9 illustrates a door coupled to a spring, according to an example implementation.

DETAILED DESCRIPTION

Disclosed embodiments will now be described more fully with reference to the accompanying Figures, in which some, but not all of the disclosed embodiments are shown. Indeed, several different embodiments may be described and should not be construed as limited to the embodiments set forth herein. Rather, these embodiments are described so that this disclosure will be thorough and complete and will fully convey the scope of the disclosure to those skilled in the art.

Figure 1:
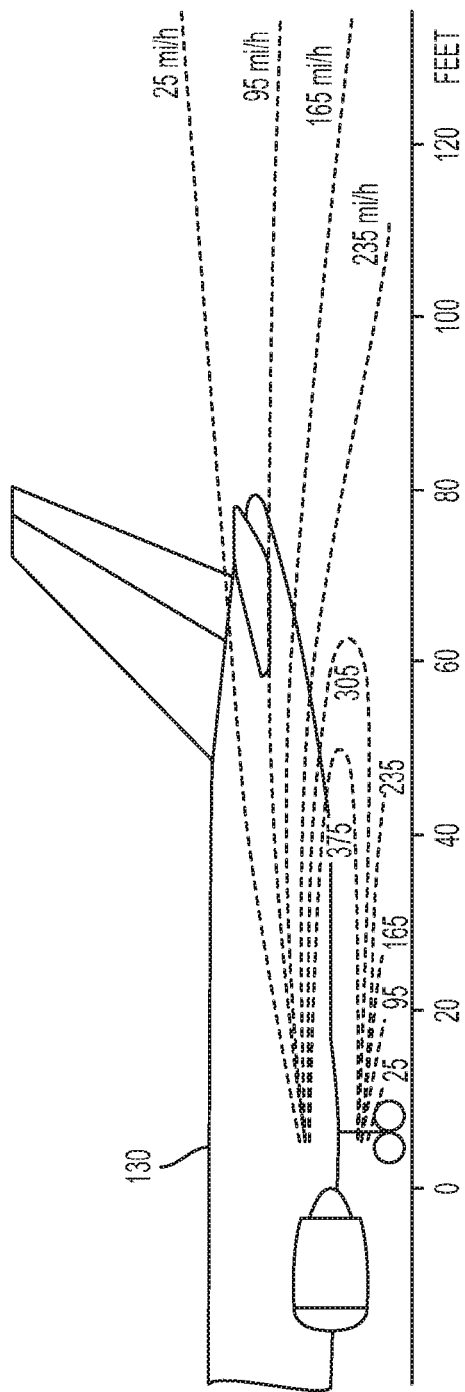
FIG. 1 shows example thrust velocities and streamlines from an example air vehicle takeoff operation.

Examples discussed herein include systems for harvesting energy in an airport environment. For instance, the engine thrust required for air vehicle takeoff operations can be significant. FIG. 1 shows an example of the thrust velocities and streamlines that may result from an example air vehicle takeoff operation. The velocities and streamlines shown in FIG. 1 may vary based on the size and configuration of the air vehicle, among other factors. Further, an air vehicle may generate similar thrust exhaust during maintenance operations, while the air vehicle remains stationary. Generally, the exhaust from these takeoff and maintenance operations dissipates, and is lost energy. Accordingly, some of the systems discussed herein involve harvesting energy from such air vehicle thrust operations. Other systems discussed herein involve harvesting energy that is expended, and may otherwise be lost, during vehicle and passenger movements throughout the airport environment.

By the term "about" or "substantially" or "approximately" with reference to amounts or measurement values, it is meant that the recited characteristic, parameter, or value need not be achieved exactly, but that deviations or variations, including for example, tolerances, measurement error, measurement accuracy limitations and other factors known to skill in the art, may occur in amounts that do not preclude the effect that the characteristic was intended to provide.

Figure 2:
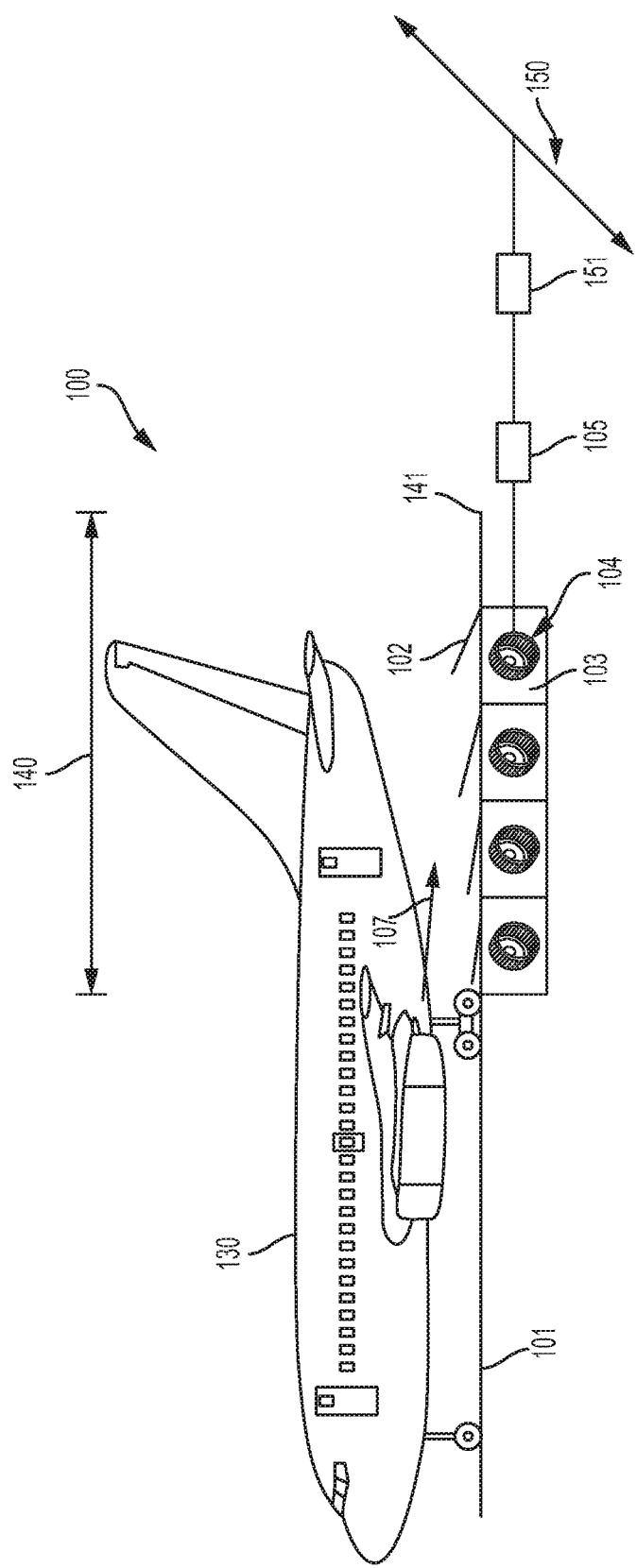
FIG. 2 illustrates an example system for harvesting energy from air vehicle thrust operations, according to an example implementation.

Referring now to FIG. 2, an example system 100 for harvesting energy from air vehicle thrust operations is shown. The system 100 includes a runway surface 101 for air vehicle takeoff and landing operations. The runway surface 101 includes a door 102 that is openable to a cavity 103 positioned below the runway surface 101. A plurality of wind turbine blades 104 are positioned within the cavity 103, and are rotatable by air flowing into the cavity 103. For instance, the air 107 shown flowing toward the cavity 103 in FIG. 2 is the engine exhaust air resulting from the takeoff operation of the air vehicle 130. A generator 105 is coupled to the plurality of wind turbine blades 104 such that the generator 105 produces electricity in response to the rotation of the plurality of wind turbine blades 104.

For purposes of this example and those that follow, the air vehicle 130 in FIG. 2 is shown as an airplane. However other air vehicles are also possible, including unmanned aerial vehicles, airplanes with different configurations, and vertical takeoff and landing air vehicles, such as helicopters, in which case the runway surface may instead be a landing pad surface, for example. Other air vehicles are also possible. Moreover, the system 100 might not be limited to harvesting energy from air vehicle thrust. In some embodiments, the plurality of wind turbine blades 104 may be positioned such that an air pressure wave preceding an air vehicle during a landing operation may rotate the plurality of wind turbine blades 104. Similarly, the plurality of wind turbine blades 104 may be rotatable by the air movement created by the passage of ground vehicles, both within airport environments and elsewhere. For example, the plurality of wind turbine blades 104 may be positioned adjacent to a roadway, or within a tunnel. Other possibilities also exist.

In the example shown in FIG. 2, the system 100 may include a plurality of doors in the runway surface 101, and each door may open to a cavity that contains a plurality of wind turbine blades 104 that are rotatable to produce electricity via a generator. The number, arrangement, and spacing of the doors may vary based on, for example, the size of the runway, the anticipated air vehicle traffic, and prevailing wind conditions, among other considerations.

In some implementations, the positioning of the plurality of wind turbine blades 104 used to capture air vehicle thrust energy discussed above may be limited to certain areas of the runway surface 101. For instance, it may be determined that energy harvesting of air vehicle thrust energy is most economical in the initial stages of takeoff, as the engines generate increasing exhaust while the air vehicle 130 remains relatively stationary, and then slowly begins to accelerate.

Accordingly, the plurality of wind turbine blades 104 may be located within an initial takeoff zone 140 of the runway 101. For example, the runway surface 101 may extend between a first end 141, as shown in FIG. 2, and a second end 142, which is distant and therefore cannot be seen in FIG. 2. However, an example of both runway ends can be seen together in FIG. 17, which shows an example of an entire runway surface 101 at a smaller scale. The initial takeoff zone 140 of the runway surface 101 may extend, for instance, one hundred feet along the runway surface 101 from the first end 141. In other embodiments, the plurality of wind turbine blades 104 may be located in an initial takeoff zone 140 that extends approximately 25% of the length of the runway surface 101, starting from the first end 141. These are just two examples, and size of the initial takeoff zone 140 may vary based on any number of considerations.

Figure 17:
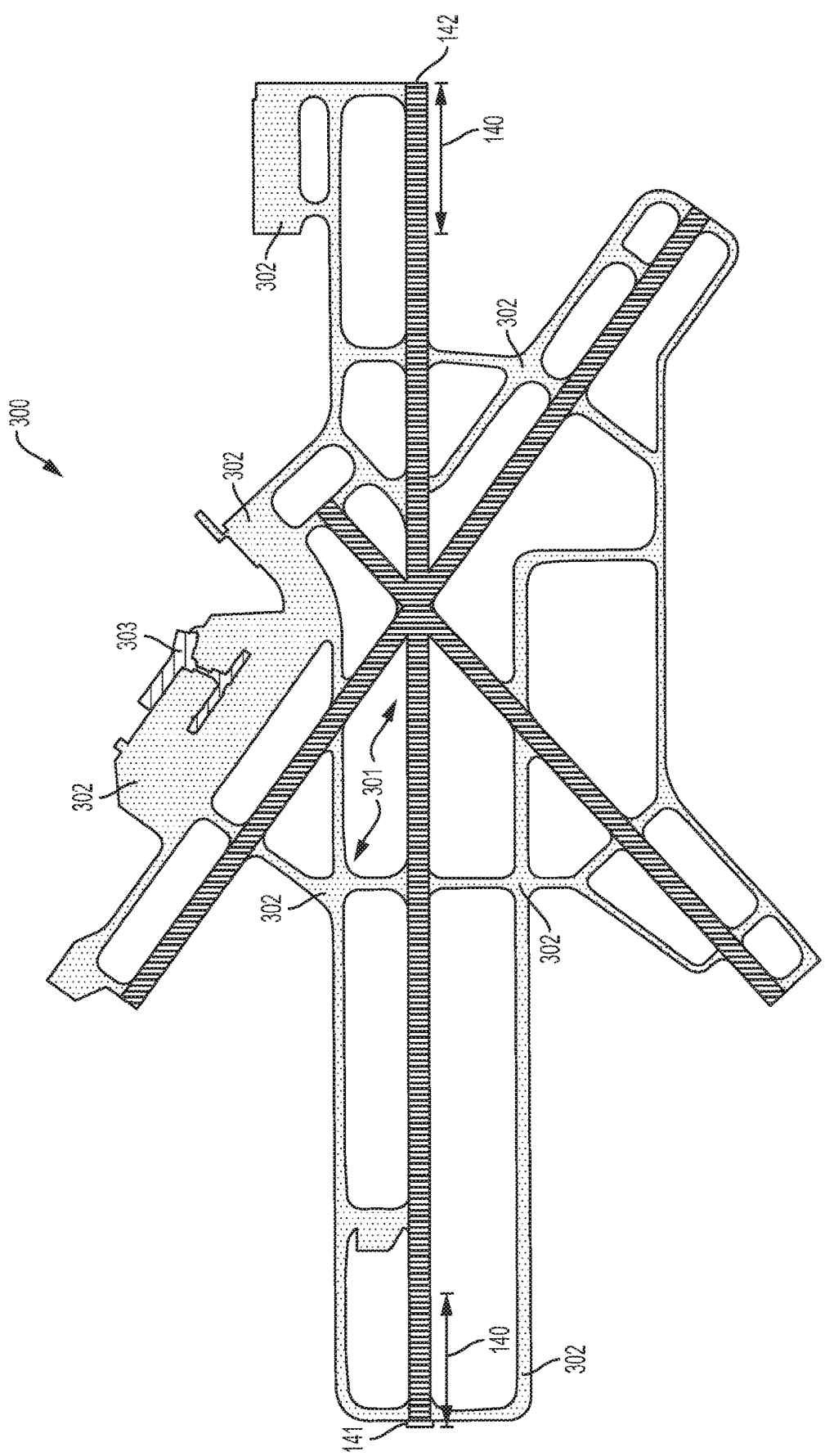
FIG. 17 illustrates a vehicular operating area and a pedestrian movement area, according to an example implementation.

In addition, some runway surfaces may be situated in areas where wind conditions and other factors result in the runway surface 101 being used for takeoff and landing operations in both directions. Thus, both ends of the runway surface 101 may include an initial takeoff zone 140, as shown in FIG. 17. Further, the first end 141 and the second end 142 of the runway surface 101 might not necessarily correspond to the termination of the paved surface. Rather, the first end 141 of the runway surface 101, and thus the beginning of the initial takeoff zone 140, may correspond to the assigned starting position for the air vehicle takeoff operation, which may generally be located at the end of an air vehicle taxiway, located approximately where the air vehicle 130 turns onto the runway surface 101.

Returning now to FIG. 2, the system 100 may further include an electricity distribution grid 150. The electricity distribution grid 150 may be a local grid serving one or more electrical loads within the airport, for example, or it may cover a broader distribution. The generator 105 may be coupled to the electricity distribution grid 150 in order to route the generated electricity to the electricity distribution grid 150. In some implementations, the generator 105 may be coupled to an alternating current converter 151, which may include a rectifier to convert the alternating current produced by the generator 105 to direct current, and then an inverter to convert the direct current back to alternating current having the appropriate frequency. In some other embodiments, the alternating current produced by the generator 105 may be rectified to direct current and then routed to a storage unit, such as a battery. Other arrangements are also possible.

Figure 3:
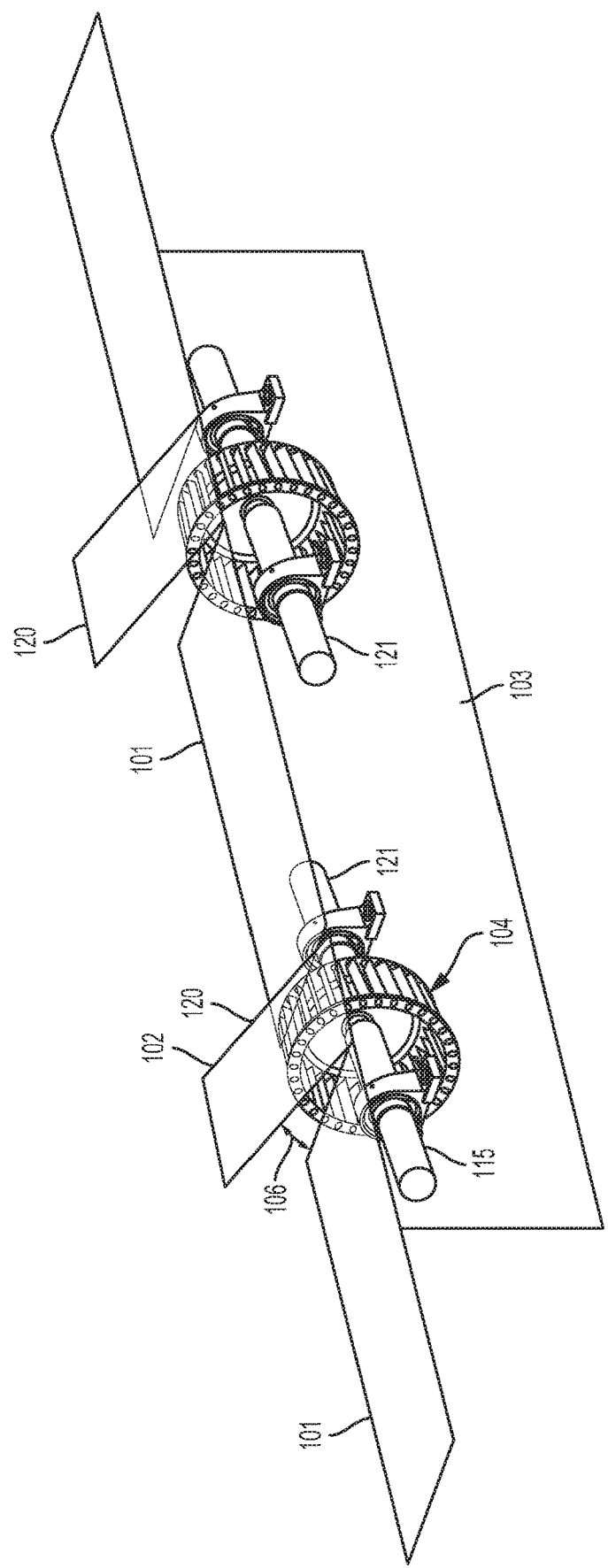
FIG. 3 illustrates a runway surface comprising a plurality of doors, according to an example implementation.

FIG. 3 shows a portion of the runway surface 101 having a plurality of doors 120, including the door 102, each of which may have an open position and a closed position. The door 102 is in an open position, where the door 102 is arrange at an angle of incline 106 with respect to the runway surface 101. In this configuration, air flowing toward the door 102, such as the air 107 from the air vehicle engine exhaust, may be redirected into the cavity 103. As can be seen among the example doors shown in FIG. 2, the angle of incline 106 may vary. The angle may be based on a number of factors, and may vary dynamically during the takeoff operation of the air vehicle 130. For example, in some implementations, the door 102 may be configured such that the angle of incline 106 with respect to the runway surface 101 changes in proportion to the velocity of the air vehicle engine exhaust air 107 flowing toward the door. Thus, doors located in a zone of higher velocity air may open wider than doors in a lower velocity zone. Other examples also exist.

FIG. 3 also illustrates the plurality of wind turbine blades 104 coupled to a rotatable shaft 115, which rotates along with the plurality of wind turbine blades 104. The rotatable shaft 115 may then be coupled to the generator shown in FIG. 2. Furthermore, FIG. 3 illustrates a plurality of rotatable shafts 121, each rotatable shaft coupled to a corresponding plurality of wind turbine blades. In some implementations, and as noted above with respect to FIG. 2, each door in the plurality of doors 120 may open to a separate cavity. Alternatively, and as shown in FIG. 3, multiple doors may open to the same cavity 103 positioned below the runway surface 101. Moreover, each door in the plurality of doors 120 may correspond to one of the rotatable shafts and its corresponding plurality of wind turbine blades. Alternatively, a single door may open to a plurality of rotatable shafts 121, each coupled to a corresponding plurality of wind turbine blades. Other combinations and arrangements are also possible.

Figure 4:
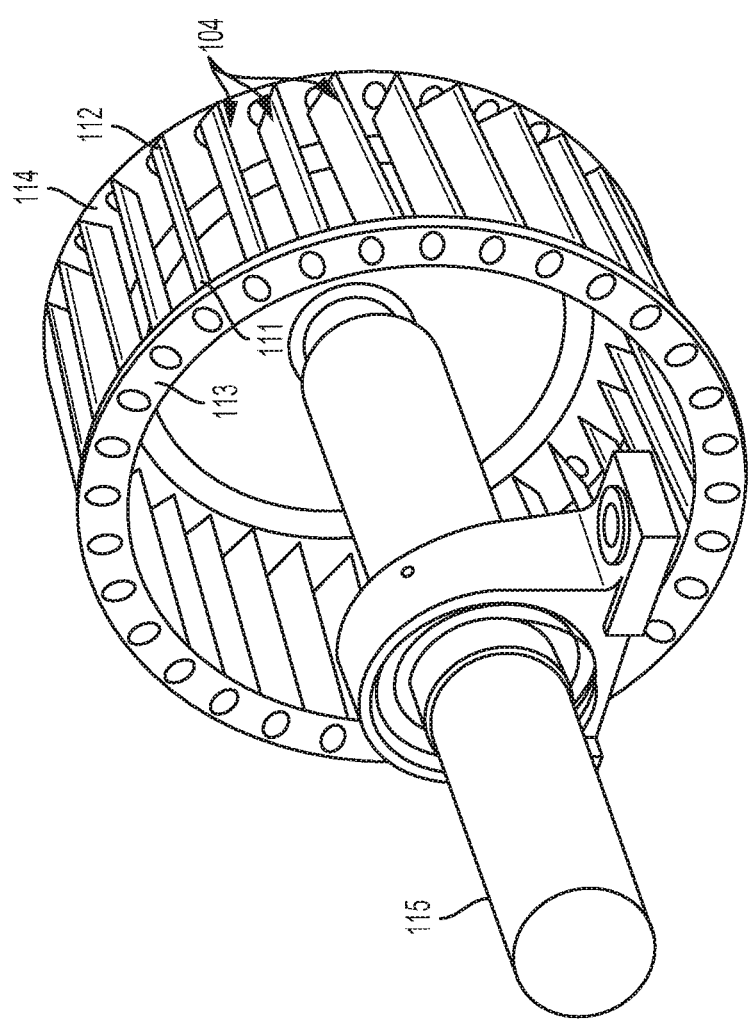
FIG. 4 illustrates a plurality of wind turbine blades, according to an example implementation.

FIG. 4 shows an example arrangement for the plurality of wind turbine blades 104, according to some implementations. In this arrangement, which is sometimes referred to as a "squirrel cage" fan, each wind turbine blade in the plurality of wind turbine blades 104 includes a first longitudinal end 111 and a second longitudinal end 112. Each blade in the plurality of wind turbine blades 104 is disposed between two parallel discs. The first disc 113 is open at its center, approximating a ring, and is coupled to each first longitudinal end 111. The second disc 114 is coupled to each second longitudinal end, and is further coupled to the rotatable shaft 115.

Other arrangements for the plurality of wind turbine blades 104 are also possible. For example, the plurality of wind turbine blades 104 may be arranged as in a typical horizontal axis wind turbine, where each blade 104 is coupled at one end to a rotatable shaft and then extends radially outward from the shaft. Further examples exist, including various vertical axis and other cross-flow wind turbine arrangements.

Figure 5:
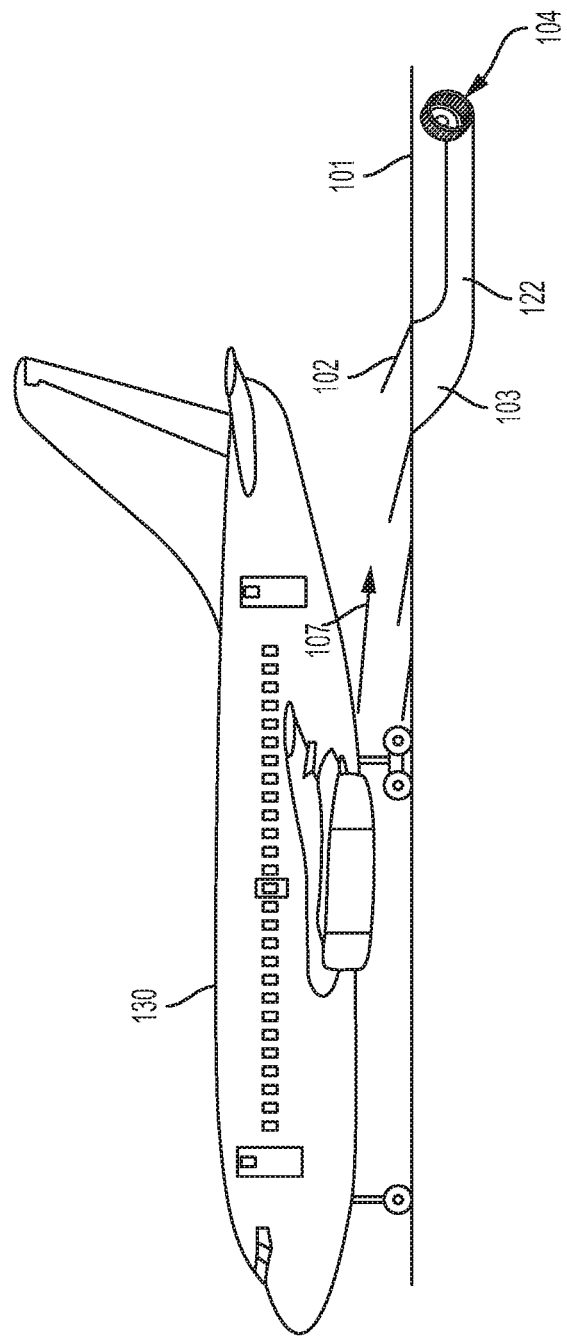
FIG. 5 illustrates a duct positioned between the runway surface and the plurality of wind turbine blades, according to an example implementation.

In the examples discussed thus far, the plurality of wind turbine blades 104 have been positioned in the cavity 103, generally below the door 102. However, in some implementations, the cavity 103 may comprise a duct 122, as shown in FIG. 5, positioned to provide a fluid connection between the runway surface 101 and the plurality of wind turbine blades 104, which may be positioned some distance away from the door 102. Accordingly, the air vehicle engine exhaust air 107 that flows toward the open door 102 may be directed into the duct 122 and toward the plurality of wind turbine blades 104. The duct 122 may take various shapes, depending on the desired characteristics of the airflow in the duct 122. For instance, the duct 122 may decrease in diameter, which may accelerate the air flowing toward the plurality of wind turbine blades 104. Other configurations are also possible. Further, the door 102 may correspond to a single duct 122, as shown in FIG. 5, or the door 102 may open to a cavity 103 containing a plurality of ducts, each leading to a plurality of wind turbine blades 104, among other combinations.

Figure 6:
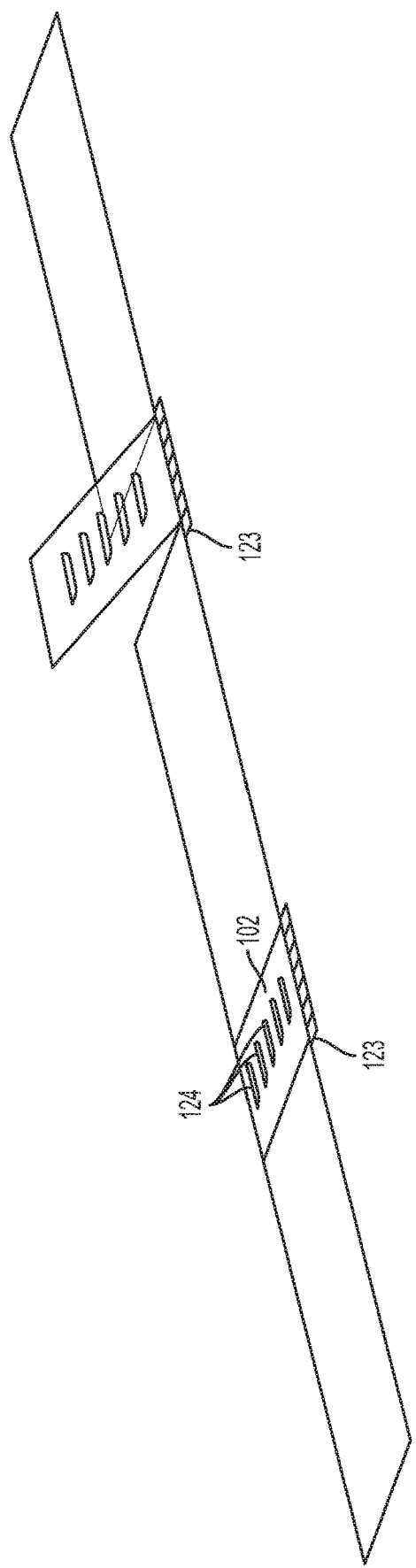
FIG. 6 illustrates a plurality of doors including louvers, according to an example implementation.

As discussed above, the door 102 includes an open position and a closed position. FIG. 6 illustrates the door 102 in the closed position, which is openable via a hinge 123. Further, the door 102 shown in FIG. 6 includes louvers 124 that are positioned to redirect the air 107 from the air vehicle engine exhaust into the cavity 103 such that, when the door 102 is in the closed position, the door 102 is openable at the hinge by the redirected air.

Figure 7:
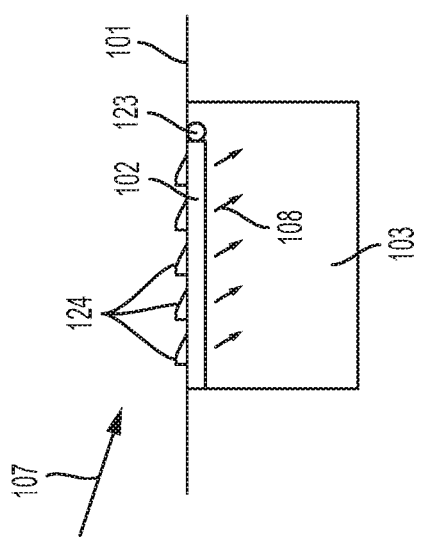
FIG. 7 illustrates a door in a closed position, according to an example implementation.

For example, FIG. 7 shows a side view of the door 102 in the closed position, and shows the air 107 from the air vehicle engine exhaust flowing toward the louvers 124. The redirected air 108 is shown redirected into the cavity 103 and the force acting on the louvers 124 may result in the door 102 opening at the hinge 123. Accordingly, FIG. 8 shows the door 102 in the open position and the air 107 from the air vehicle engine exhaust is now flowing toward the bottom side of the door and is thereby redirected into the cavity 103, where it may rotate the plurality of wind turbine blades 104 therein (not shown in FIG. 7).

Figure 8:
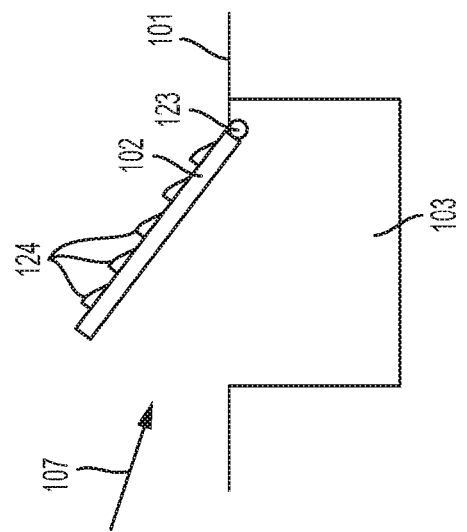
FIG. 8 illustrates a door in an open position, according to an example implementation.

In FIGS. 7 and 8 and in the discussion above, the door 102 is depicted as being in a naturally closed position. FIG. 9 illustrates an alternative implementation, where the door 102 may be coupled to a spring 125 that maintains the door 102 in an open position. The spring may maintain the door 102 at an angle of incline 106 with respect to the runway surface 101, as shown in FIG. 3 and as discussed above, until acted on by a force. For instance, the spring 125, which is depicted in FIG. 9 as a hinge spring acting in conjunction with the hinge 123, may be responsive to the force applied on the open door 102 by the air 107 from the engine exhaust, allowing the door 102 to open beyond its neutral position. Other types of springs are also possible. Additionally, the door 102 may be closeable by compressing the spring 125, thereby decreasing the angle of incline 106 with respect to the runway surface 101. For example, a force 128, such as the force of a wheel passing over the door 102, may compress the spring 125 and close the door 102.

However, as mentioned above, air vehicle and ground vehicle traffic on the runway surface 101 may not always approach the door 102 from the same direction. As such, an open door 102 may pose a safety issue for a vehicle approaching it from its open side, or from a lateral direction. Therefore, additional components to facilitate the opening and closing of the door 102 may be desirable in some situations. For instance, the door 102 may be coupled to a proximity sensor 126 such that the door 102 is openable or closeable in response to the detection of an air vehicle 130, ground vehicle, or any other vehicle approaching the proximity sensor 126.

Figure 10:
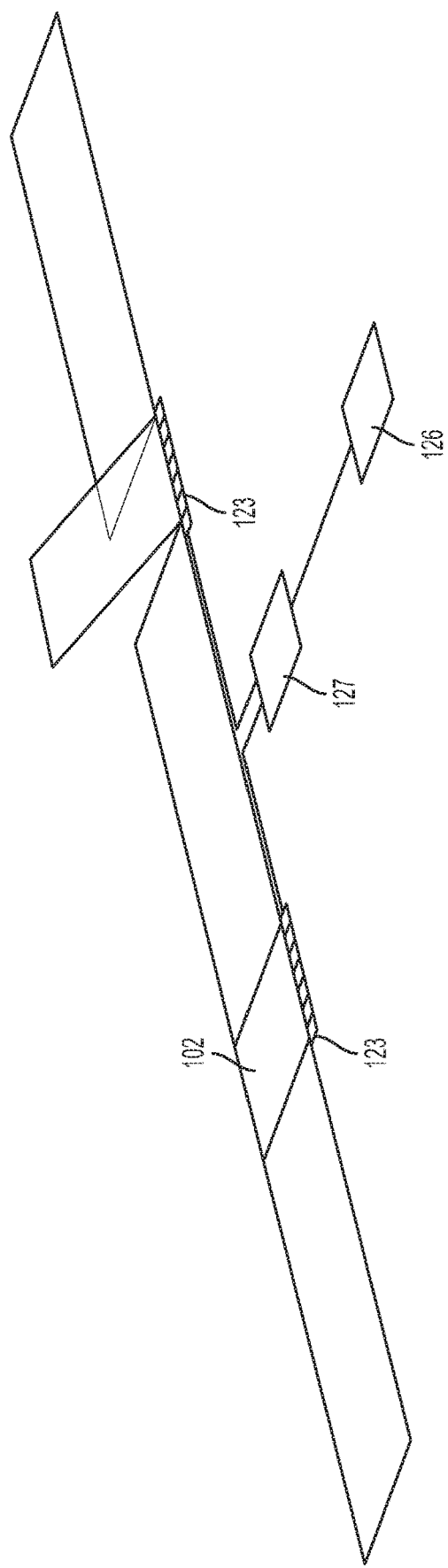
FIG. 10 illustrates a door coupled to a proximity sensor and a motor, according to an example implementation.

FIG. 10 illustrates the door 102 coupled to a proximity sensor 126 which is positioned some distance away from the door 102. The distance may be one hundred feet, for example, or any other distance that would give the door 102 sufficient time to open or close in response to a signal from the proximity sensor 126, based on anticipated speeds of approaching vehicles. The proximity sensor may take any form, such as a piezoelectric sensor, an inductance loop, an optical sensor, or even a pneumatic sensor, among others, that may detect an approaching vehicle.

In the configuration shown in FIG. 10, the proximity sensor 126 is positioned downwind of the door 102 (with respect to the air vehicle engine exhaust air), and thus it may signal the door 102 to close in response to an approaching vehicle. Additionally or alternatively, the proximity sensor 126 may be positioned upwind of the door 102, or lateral to the door 102, and thus it may signal the door 102 to close when vehicles are approaching from these directions as well. Further, the proximity sensor 126 may be positioned such that it detects when an air vehicle 130 is in the initial takeoff zone 140, and may signal the door 102 to open in anticipation of the air vehicle engine exhaust air 107 in this example. Other positions and applications for the proximity sensor 126 are also possible.

FIG. 10 also illustrates a motor 127 coupled to the door 102. The motor 127 is operable to move the door 102 between the open and closed position. For instance, the motor 127 may be coupled to the proximity sensor 126, and may open and close the door 102 in response to signals from the proximity sensor 126. Additionally or alternatively, the motor 127 may be coupled to additional communications interfaces, with or without the proximity sensor 126, which may allow the door 102 to be opened or closed via a user command, such as a user command from the airport control tower.

Finally, the system 100 may, in some embodiments, be implemented in other areas where air vehicle thrust energy may be harvested, other than on a runway surface 101. For example, during some maintenance operations, the air vehicle 130 may run its engines at substantially full power for a period of time, while the air vehicle 130 is prevented from moving, and therefore remains stationary. The air vehicle 130 may, for instance, apply its wheel brakes during the maintenance operation. Thus, the system 100 may be implemented in a location where such maintenance operations are performed.

Figure 11:
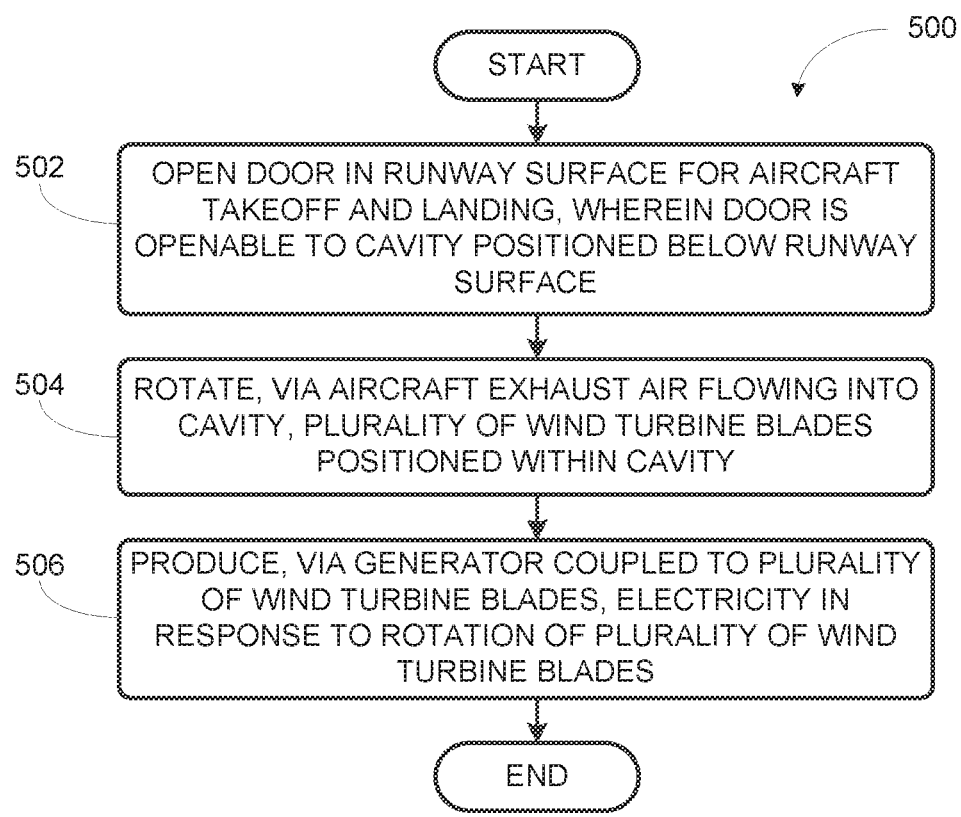
FIG. 11 shows a flowchart of an example method for harvesting energy from air vehicle thrust operations.

FIG. 11 shows a flowchart of an example method 500 for harvesting energy from air vehicle thrust operations, according to an example implementation. Method 500 shown in FIG. 11 presents an embodiment of a method that, for example, could be used with the system 100 as shown in FIGS. 1-10 and discussed herein. It should be understood that for this and other processes and methods disclosed herein, flowcharts show functionality and operation of one possible implementation of present embodiments. In this regard, each block in the flowchart may represent a module, a segment, or a portion of program code, which includes one or more instructions executable by a processor for implementing specific logical functions or steps in the process. Alternative implementations are included within the scope of the example embodiments of the present disclosure, in which functions may be executed out of order from that shown or discussed, including substantially concurrent or in reverse order, depending on the functionality involved, as would be understood by those reasonably skilled in the art.

At block 502, the method 500 includes opening a door 102 in a runway surface 101 for air vehicle takeoff and landing, where the door 102 is openable to a cavity 103 positioned below the runway surface 101. As discussed above, the door 102 may be openable by a spring 125 or a motor 127, among other possibilities, and further, the door 102 may be openable in response to various conditions that may be detected, or commands that may be received.

As noted above, the implementations discussed herein may further involve a plurality of doors 120 arranged in an initial takeoff zone 140 of the runway surface 101, each door 102 in the plurality of doors 120 corresponding to a rotatable shaft 115 that is coupled to a plurality of wind turbine blades 104. Thus, the method 500 may involve opening a plurality of doors 102.

Further, as discussed with respect to FIG. 5, the method 500 may involve routing the air 107 from the air vehicle engine exhaust to the plurality of wind turbine blades 104 via a duct 122 that provides a fluid connection between the runway surface 101 and the plurality of wind turbine blades 104.

At block 504, the method 500 includes rotating, via air vehicle engine exhaust air 107 flowing into the cavity 103, a plurality of wind turbine blades 104 positioned within the cavity 103. For instance, the door 102 may be arranged in an open position, at an angle of incline 106 with respect to the runway surface 101, such that the air vehicle exhaust air 107 is redirected into the cavity 103 and the plurality of wind turbine blades 104 are rotated by the redirected air. Within the cavity 103, the plurality of wind turbine blades 104 may be coupled to a rotatable shaft 115, as in the examples above.

At block 506, the method 500 includes producing, via a generator 105 that is coupled to the plurality of wind turbine blades 104, electricity in response to the rotation of the plurality of wind turbine blades 104. The electricity may be converted, for example, and/or routed to an electricity distribution grid 150, as noted above.

Figure 12:
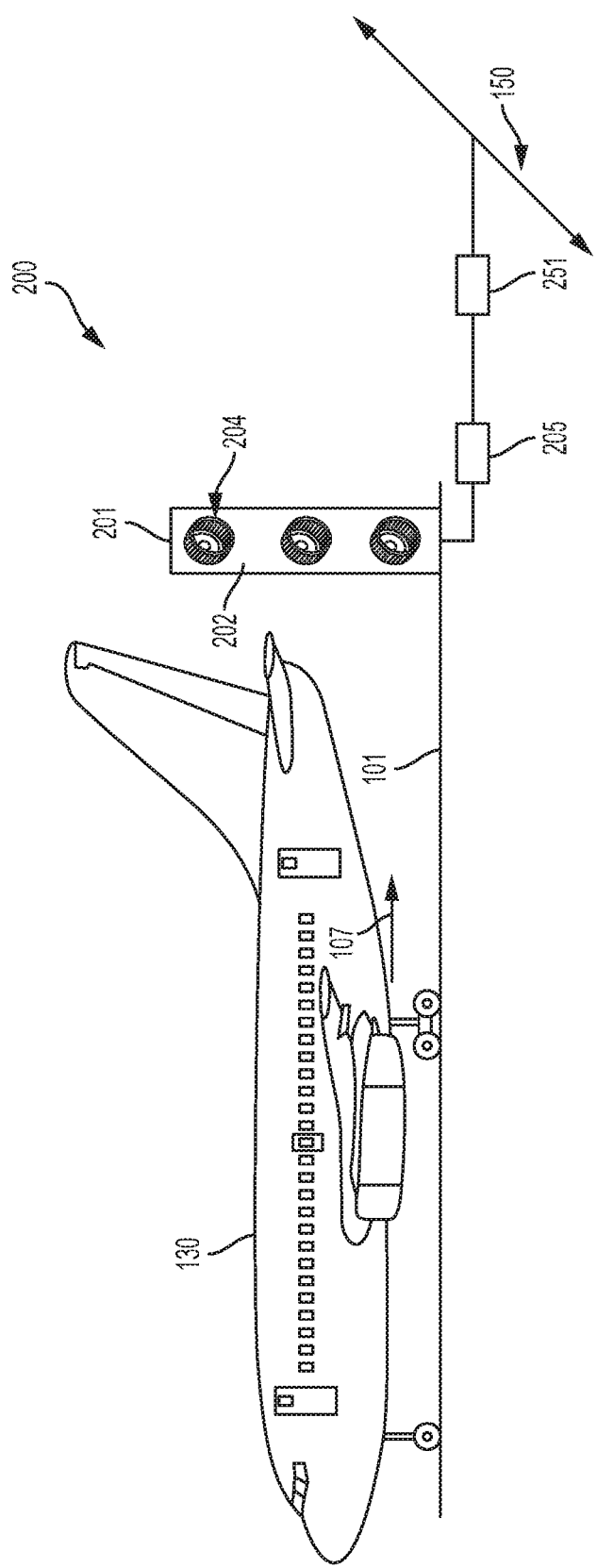
FIG. 12 illustrates another example system for harvesting energy from air vehicle thrust operations, according to an example implementation.

Additional implementations for harvesting energy from air vehicle thrust operations may include a blast fence 201, as shown in FIG. 12. In the example shown in FIG. 12 and those that follow, the blast fence 201 will be described with respect to a system 200 that is separate from the system 100 discussed above. However, the blast fence 201 in the examples discussed below may be implemented in conjunction with any or all of the components already mentioned. For instance, the plurality of wind turbine blades 104 discussed above may be a first plurality of wind turbine blades 104, and the plurality of wind turbine blades 204 discussed below may be a second plurality of wind turbine blades 204. Similarly, the generator 205 discussed below may be a second generator 205 with respect to the first generator 105 noted above.

As shown in FIG. 12, the system 200 for harvesting energy from air vehicle thrust operations includes a blast fence 201 extending from the runway surface 101, which includes a plurality of wind turbine blades 204. The plurality of wind turbine blades 204 are rotatable by air flowing toward the blast fence 201, such as the air vehicle engine exhaust air 107 from the air vehicle 130. The plurality of wind turbine blades 204 may be supported within the blast fence 201, and the blast fence 201 may be generally composed of, a support structure 202.

The system 200 may additionally include a generator 205 coupled to the plurality of wind turbine blades 204. Although a single generator 205 is shown in FIG. 12, each plurality of wind turbine blades 204 that is positioned within the blast fence 201 may be coupled to its own corresponding generator. The generator 205 may produce electricity in response to the rotation of the plurality of wind turbine blades 204. The system 200 may also include the electricity distribution grid 150 mentioned above, and the generator 205 may be coupled to the electricity distribution grid 150 in order to route the generated electricity to the electricity distribution grid 150. In some implementations, the generator 205 may be coupled to an alternating current converter 251, similar to the alternating current converter 151 discussed above. Further, the alternating current produced by the generator 205 may be rectified to direct current and then routed to a storage unit, such as a battery. Other arrangements are also possible.

The blast fence 201 is shown as substantially vertical in FIG. 12, however other orientations are also possible. For instance, the top of the blast fence 201 may be angled away from the rear of the air vehicle 130, such that any excess air vehicle engine exhaust air 107 that does not rotate the plurality of wind turbine blades 204 or otherwise pass through the blast fence 201 is deflected upward, which may reduce stresses on the blast fence 201. Further, in some implementations, the support structure 202 of the blast fence 201 may be permeable, or semi-permeable, so as to reduce the stress on the blast fence 201.

Figure 13:
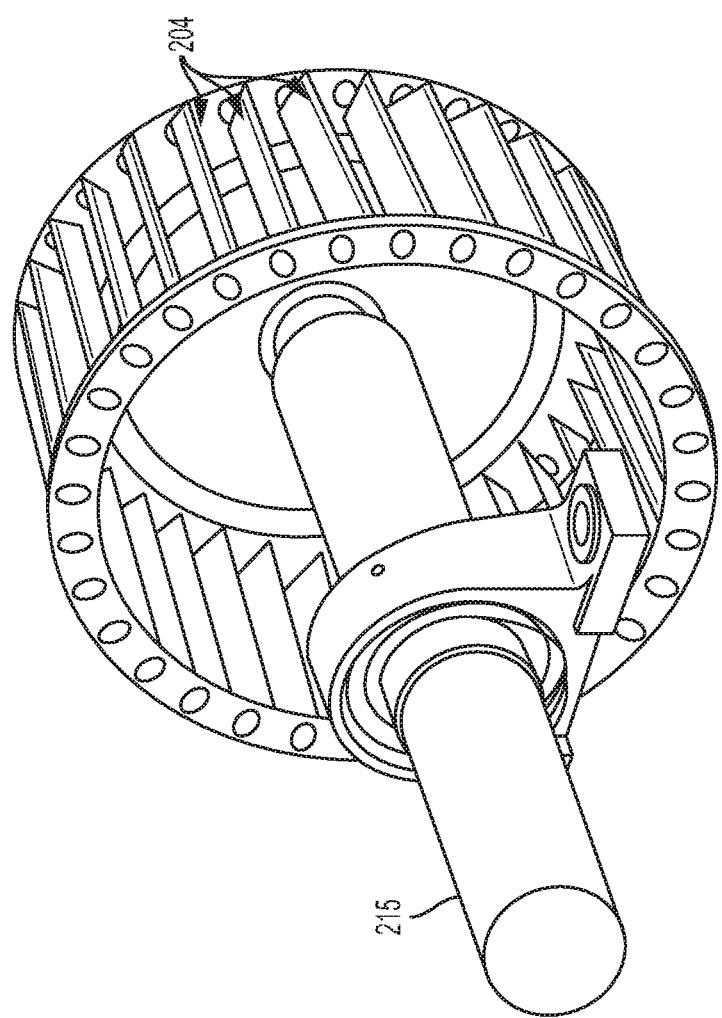
FIG. 13 illustrates a plurality of wind turbine blades, according to an example implementation.

FIG. 13 shows an example arrangement for the plurality of wind turbine blades 204, which is similar to the "squirrel cage" fan shown in FIG. 4. The plurality of wind turbine blades 204 are coupled to a rotatable shaft 215, which may in turn be coupled to the generator 205.

Figure 14:
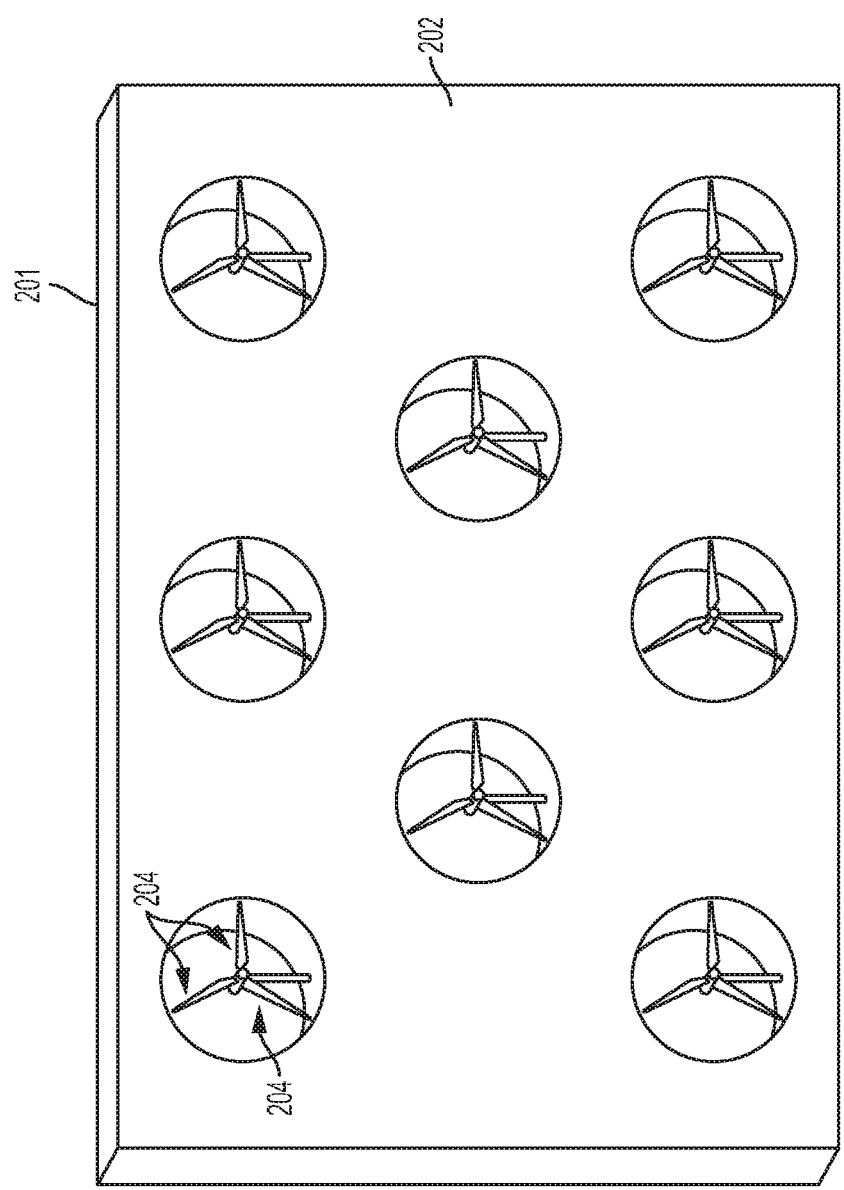
FIG. 14 illustrates a blast fence, according to an example implementation.

Other wind turbine configurations are also possible for the blast fence 201. FIG. 14 shows a front view of an example blast fence 201 that includes several horizontal axis wind turbines. In this arrangement, each blade in the plurality of wind turbine blades 204 is coupled at one end to a rotatable shaft and then extends radially outward from the shaft. Other examples exist, including various vertical axis and other cross-flow wind turbine arrangements.

Compared to the runway surface doors and subsurface wind turbine blades discussed above, the blast fence 201 may present more of an obstacle for air vehicle and ground vehicle operations. Therefore, the blast fence 201 may be movable with respect to the runway surface 101. For instance, the blast fence 201 may include wheels that allow it to be rolled from one position to another. In other implementations, the blast fence 201 may be positioned on a platform or the like that may allow the blast fence 201 to be rotated, for example, ninety degrees on the runway surface 101. Alternatively, the blast fence 201 may be positioned on a track or rail that allows it to be moved laterally with respect to the runway surface 101.

Figure 15:
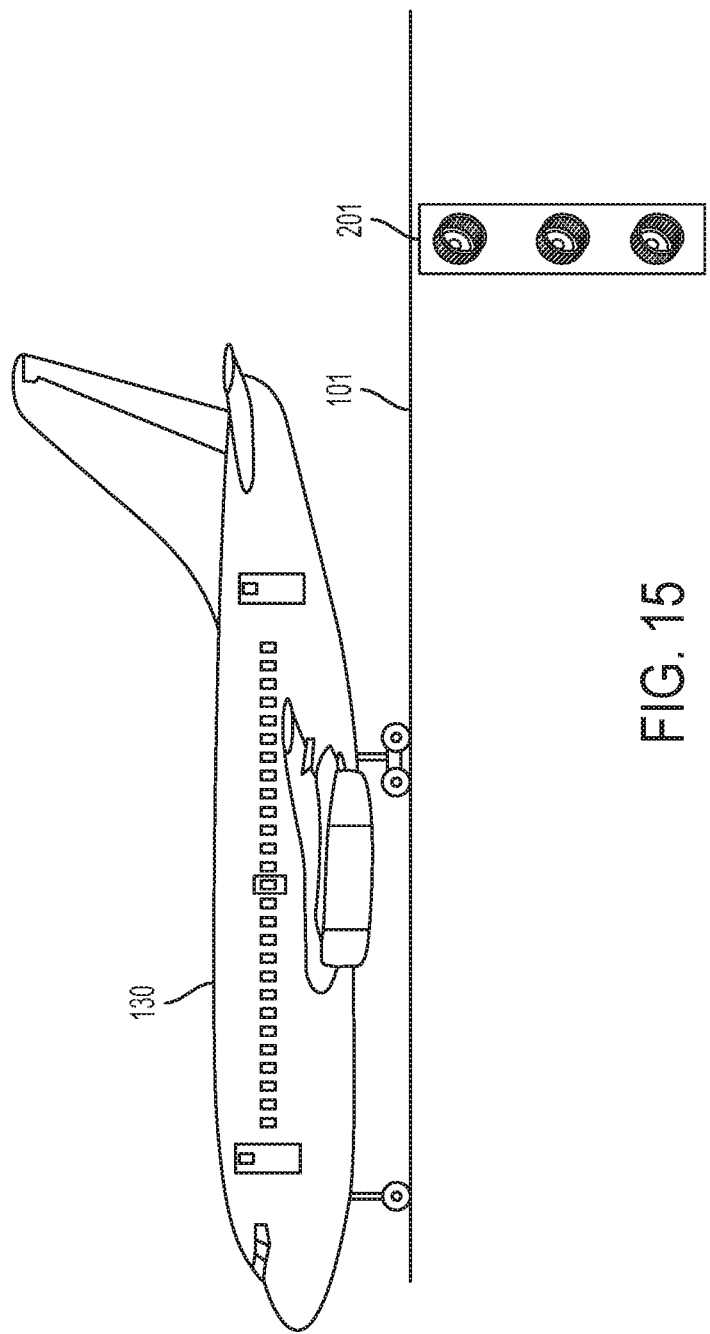
FIG. 15 illustrates a blast fence in a recessed position below the runway surface, according to an example implementation.

As another example, the blast fence 201 may be movable to a recessed position below the runway surface 101. For example, the blast fence 201 may be coupled to hydraulic actuators that may move it between an operative position above the runway surface 101 and a recessed position. FIG. 15 shows the blast fence 201 lowered vertically below the runway surface 101. Other possibilities also exist.

Finally, as noted above with respect to the system 100, the blast fence 201 of system 200 may be implemented in other areas where air vehicle thrust energy may be harvested, other than on the runway surface 101. For instance, a blast fence 201 may be positioned in a maintenance location, where the air vehicle 130 may run its engines at substantially full power for a period of time, while the air vehicle 130 is prevented from moving by other means, and therefore remains stationary.

Figure 16:
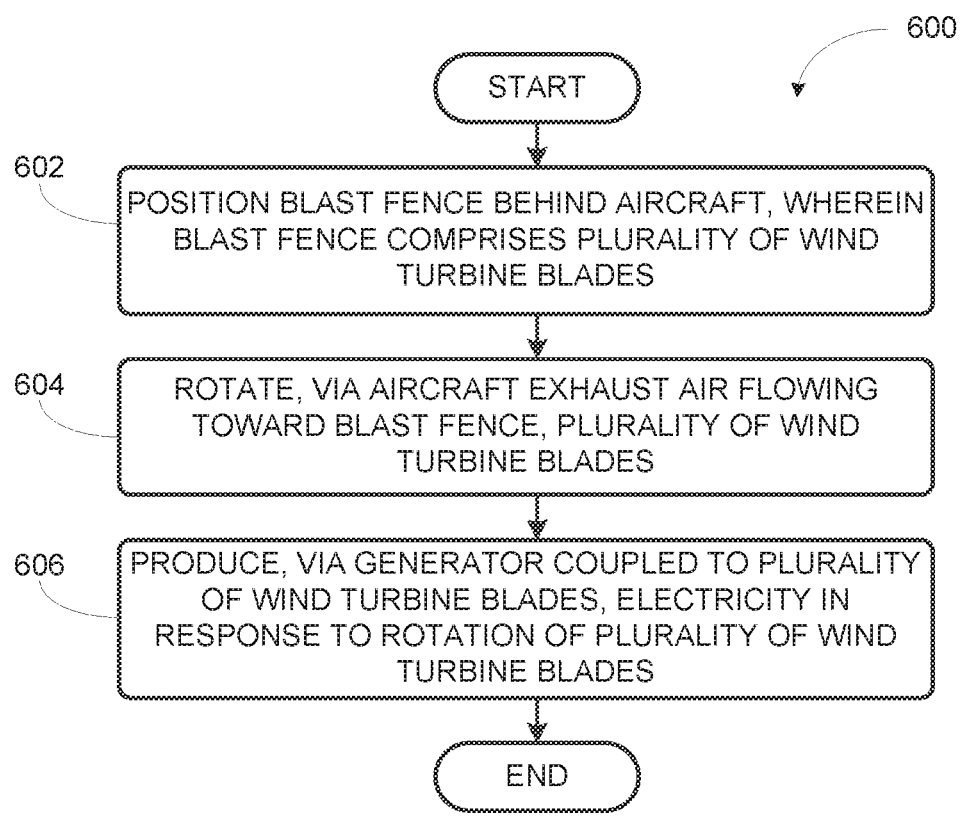
FIG. 16 shows a flowchart of another example method for harvesting energy from air vehicle thrust operations.

FIG. 16 shows a flowchart of an example method 600 for harvesting energy from air vehicle thrust operations, according to an example implementation. Method 600 shown in FIG. 16 presents an embodiment of a method that, for example, could be used with the system 200 as shown in FIGS. 12-15 and discussed herein. It should be understood that for this and other processes and methods disclosed herein, flowcharts show functionality and operation of one possible implementation of present embodiments. In this regard, each block in the flowchart may represent a module, a segment, or a portion of program code, which includes one or more instructions executable by a processor for implementing specific logical functions or steps in the process. Alternative implementations are included within the scope of the example embodiments of the present disclosure, in which functions may be executed out of order from that shown or discussed, including substantially concurrent or in reverse order, depending on the functionality involved, as would be understood by those reasonably skilled in the art.

At block 602, the method 600 includes positioning a blast fence 201 behind an air vehicle 130, wherein the blast fence 201 includes a plurality of wind turbine blades 204. As noted above, positioning the blast fence 201 may involve rolling the blast fence 201 on wheel, sliding it along a track or rail, or lifting it from a recessed position below a runway surface 101, among other possibilities.

In addition, positioning the blast fence 201 behind the air vehicle 130 may encompass moving the air vehicle 130 to a position that is in front of an otherwise stationary blast fence 201, such as in a maintenance application.

At block 604, the method 600 includes rotating, via air vehicle engine exhaust air 107 flowing toward the blast fence 201, a plurality of wind turbine blades 204.

At block 606, the method 600 includes producing, via a generator 205 that is coupled to the plurality of wind turbine blades 204, electricity in response to the rotation of the plurality of wind turbine blades 204. The electricity may be converted, for example, and/or routed to an electricity distribution grid 150, as noted above.

Referring now to FIG. 17, an example system 300 for harvesting energy from airport vehicle and passenger movements is shown. In particular, the system 300 may be configured to harvest vibration energy resulting from the vehicle and pedestrian movements. The system 300 may be implemented in an airport environment, an example of which is illustrated in FIG. 17. However, other environments are also possible. Further, the system 300 discussed in the examples that follow may be implemented independently of, or in conjunction with, any or all of the energy harvesting components already mentioned, such as those in system 100 or system 200.

The system 300 may include, for instance, a vehicular operating area 301, which may include runway surfaces 101, taxiways, and other paved areas surrounding the airport terminal where air vehicle and other airport ground vehicles may operate. Further, the system 300 may include a pedestrian movement area 303, where passengers generally move about on foot. In FIG. 17, the entire terminal is indicated as the pedestrian movement area 303. However, other areas are also possible, including walkways between multiple terminals in a larger airport, mass transit stations surrounding the airport, and the like.

Figure 18:
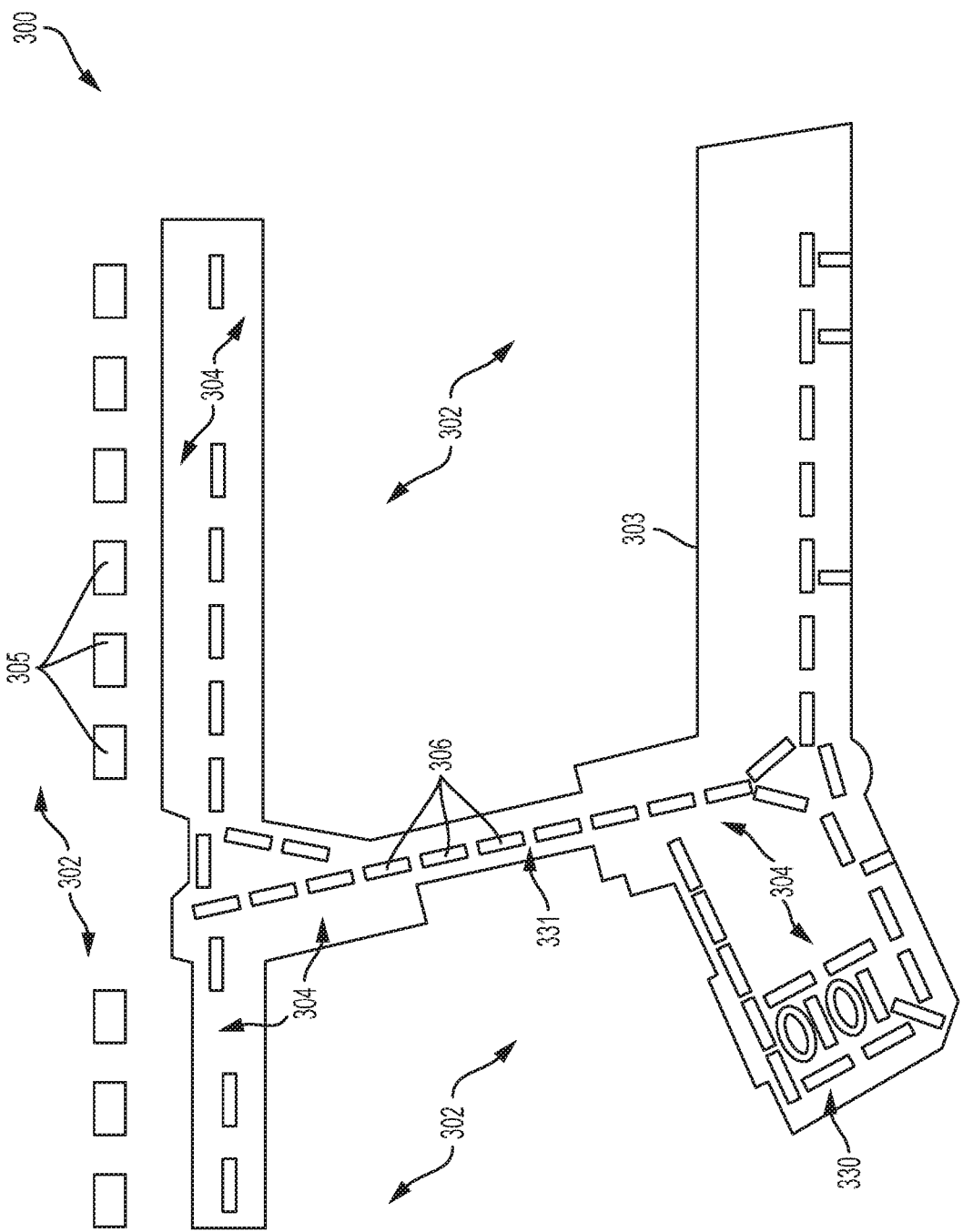
FIG. 18 illustrates a first plurality of vibration panels and a second plurality of vibration panels, according to an example implementation.

FIG. 18 shows a more detailed view of a portion of the vehicular operating area 301 that surrounds the pedestrian movement area 303, depicted here by the airline terminal. The vehicular operating area 301 includes an operating surface 302, which the air vehicle and other ground vehicles make contact with as they drive about the vehicular operating area. The operating surface 302 may include, for example, a concrete or asphalt pavement section, the design of which may vary depending on a number of factors such as expected loading, climate, and underlying geotechnical conditions, among others.

Further, the pedestrian movement area 303 may include walking surface 304, which pedestrians make contact with as they move about within the pedestrian movement area 303. For instance, the walking surface 304 may include the floor of the terminal, which may include carpet, tile, or other surfaces suitable for pedestrian movements. Additionally, the walking surface 304 may include other features such as stairs, moving walkways, and the jetways through which passengers move to board an air vehicle from the terminal. Other areas of pedestrian traffic may be included within the walking surface 304 as well.

As shown in FIG. 18, a first plurality of vibration panels 305 may be positioned within the operating surface 302. For example, the first plurality of vibration panels 305 may be positioned in areas with a high volume of air vehicle and/or ground vehicle traffic, such as the gate area surrounding the terminal. Other areas having a high volume of vehicular traffic may include choke points where multiple runways and or taxiways intersect within the vehicular operating area 301. In some implementations, the first plurality of vibration panels 305 may also be positioned in areas that experience a relatively high magnitude of vibration, such as the takeoff and landing zones of the runway surface 101. Other locations for the first plurality of vibration panels 305 are also possible.

Further, each vibration panel in the first plurality of vibration panels 305 includes a piezoelectric transducer 309. Each piezoelectric transducer 309 may be coupled to an electricity distribution grid 150, such that electricity produced by each piezoelectric transducer 309, in response to vibrations from vehicle movements, is routed to the electricity distribution grid 150.

Additionally, a second plurality of vibration panels 306 may be positioned with the walking surface 304. As above, the second plurality of vibration panels 306 may be positioned in areas of high pedestrian volume, such as a baggage claim area 330, a security screening area 331, or more generally, the primarily-used walkways throughout the pedestrian movement area 303. This may include, as previously mentioned, the second plurality of vibration panels 306 being positioned within stairs, or within the floor of a jetway.

As with the first plurality of vibration panels 305, each vibration panel in the second plurality of vibration panels 306 includes a piezoelectric transducer 309. Again, each piezoelectric transducer 309 may be coupled to the electricity distribution grid 150, such that electricity produced by each piezoelectric transducer 309, here in response to vibrations from pedestrian movements, is routed to the electricity distribution grid 150.

Figure 19:
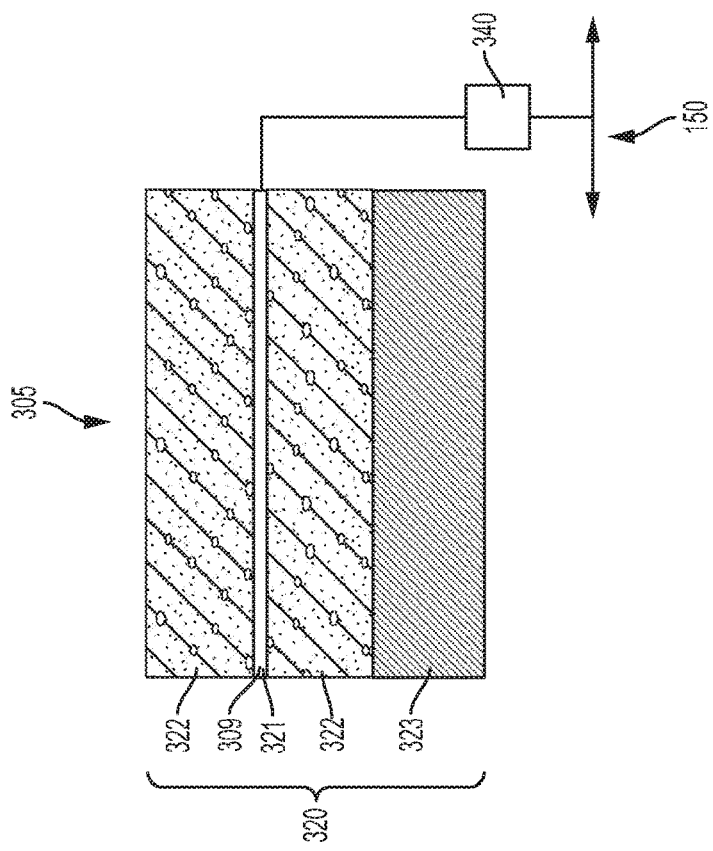
FIG. 19 illustrates a piezoelectric transducer in a pavement cross section, according to an example implementation.

Referring now to FIG. 19, an example of a vibration panel from the first plurality of vibration panels 305 is shown. As noted above, each vibration panel in the first plurality of vibration panels 305 includes a piezoelectric transducer 309, which may include a layer of piezoelectric crystal material 321 positioned within a pavement cross section 320 of the operating surface 302. The position of the layer of piezoelectric crystal material 321 within the cross section 320 may depend on a number of factors, such as the anticipated loading, the piezoelectric sensitivity of the material, among other possibilities. For example, the example pavement cross section 320 shown in FIG. 19 includes an aggregate base course 323 beneath two layers of poured concrete 322, with the layer of piezoelectric crystal material 321 is sandwiched between the two layers of concrete 322.

Figure 20:
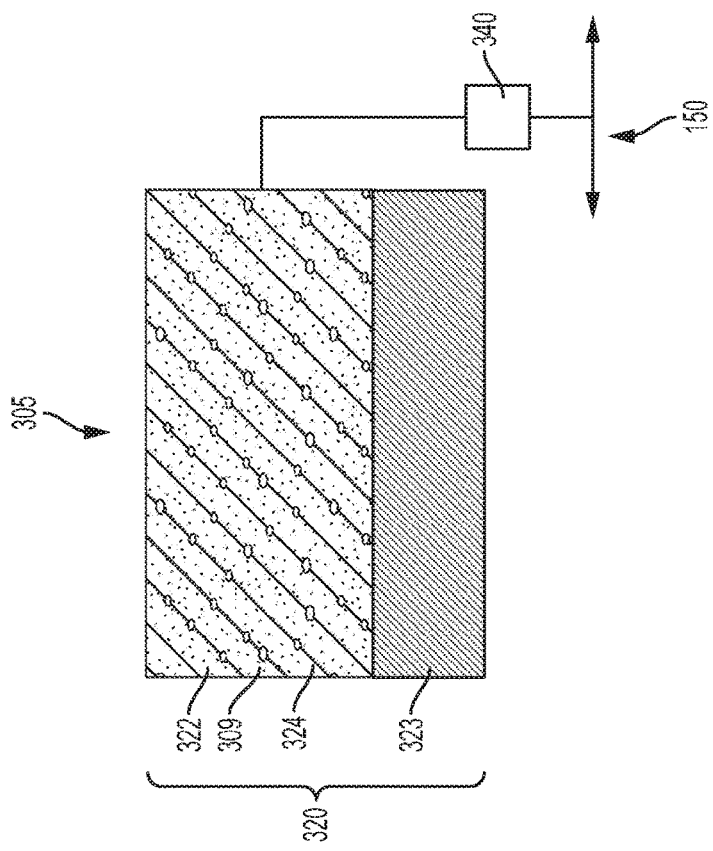
FIG. 20 illustrates a piezoelectric transducer in a pavement cross section, according to another example implementation.

Other configurations are also possible. For instance, FIG. 20 shows another example of a vibration panel from the first plurality of vibration panels 305. In this example, the piezoelectric transducer 309 includes a layer of piezoelectric ceramic material 324 positioned within the pavement cross section 320. In some implementations, such as the example shown in FIG. 20, a concrete mixture may include cement having piezoelectric ceramic additives, which may allow the concrete to behave as a piezoelectric transducer. Thus, the concrete 322 in the example pavement cross section 320 of FIG. 20 is also the layer of piezoelectric ceramic material 324. Other configurations and combinations also exist, including a layer of piezoelectric ceramic material 324 that is not integral with the concrete 322 of the pavement cross section 320, or a pavement cross section 320 having both piezoelectric concrete and non-piezoelectric concrete layers.

Figure 21:
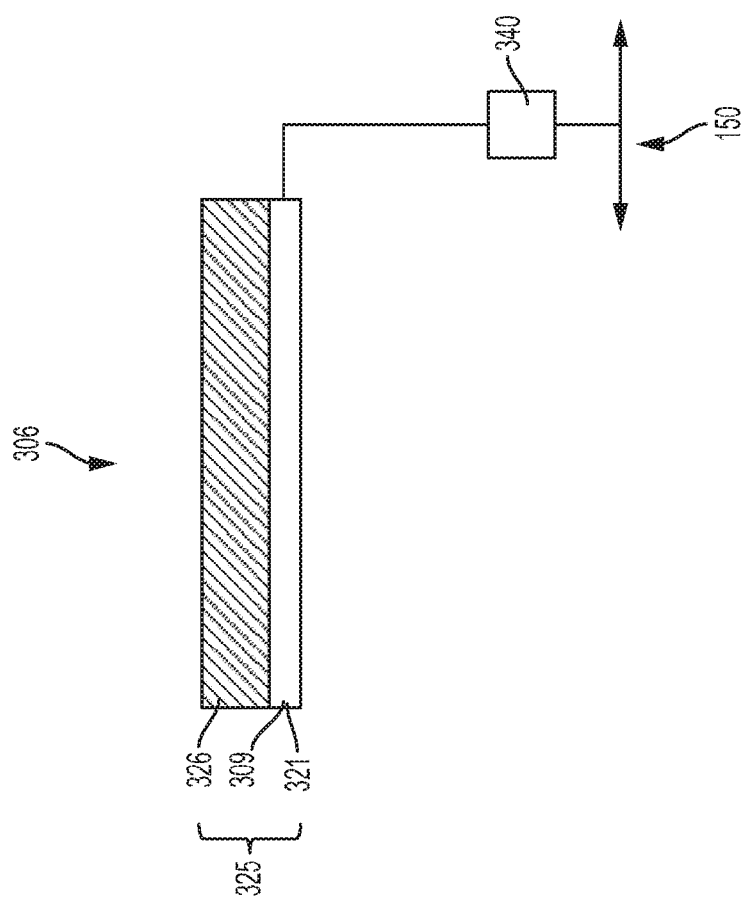
FIG. 21 illustrates a piezoelectric transducer in a floor cross section, according to an example implementation.

FIG. 21 shows an example of a vibration panel from the second plurality of vibration panels 306. Each vibration panel in the second plurality of vibration panels 306 includes a piezoelectric transducer 309. As discussed above, the piezoelectric transducer 309 in the vibration panel 306 may include, a layer of piezoelectric crystal material 321 positioned within a floor section 325 of the walking surface 304. In FIG. 21, the example floor section 325 includes the layer of piezoelectric crystal material 321 beneath a floor tile 326, although other components and materials are also possible. Further, the piezoelectric transducer 309 in the vibration panel 306 may include a layer of piezoelectric ceramic material 324, as noted above.

In each of the FIGS. 19-21, the piezoelectric transducer 309 is coupled to a storage unit 340, which may be a battery or series of batteries, for example. The electricity produced by each piezoelectric transducer 309 may be routed to the storage unit 340, charging the battery, prior to the electricity distribution grid 150. As discussed above with respect to harvesting energy from air vehicle thrust operations, the produced electricity may be rectified, inverted, or otherwise converted as necessary depending on the particular application and routing of the produced electricity.

The vibration panels discussed herein may not be limited to positions within the operating surface 302 or the walking surface 304 of the airport. For example, the landing operation of an air vehicle may create vibrations on the runway surface 101 due to the landing gear of the runway contacting the runway surface 101, as well as vibrations due to air pressure waves caused by the air vehicle 130 moving through the air. This pressure wave may not only introduce vibrations at the runway surface 101, but adjacent to the runway surface 101 as well.

Figure 22:
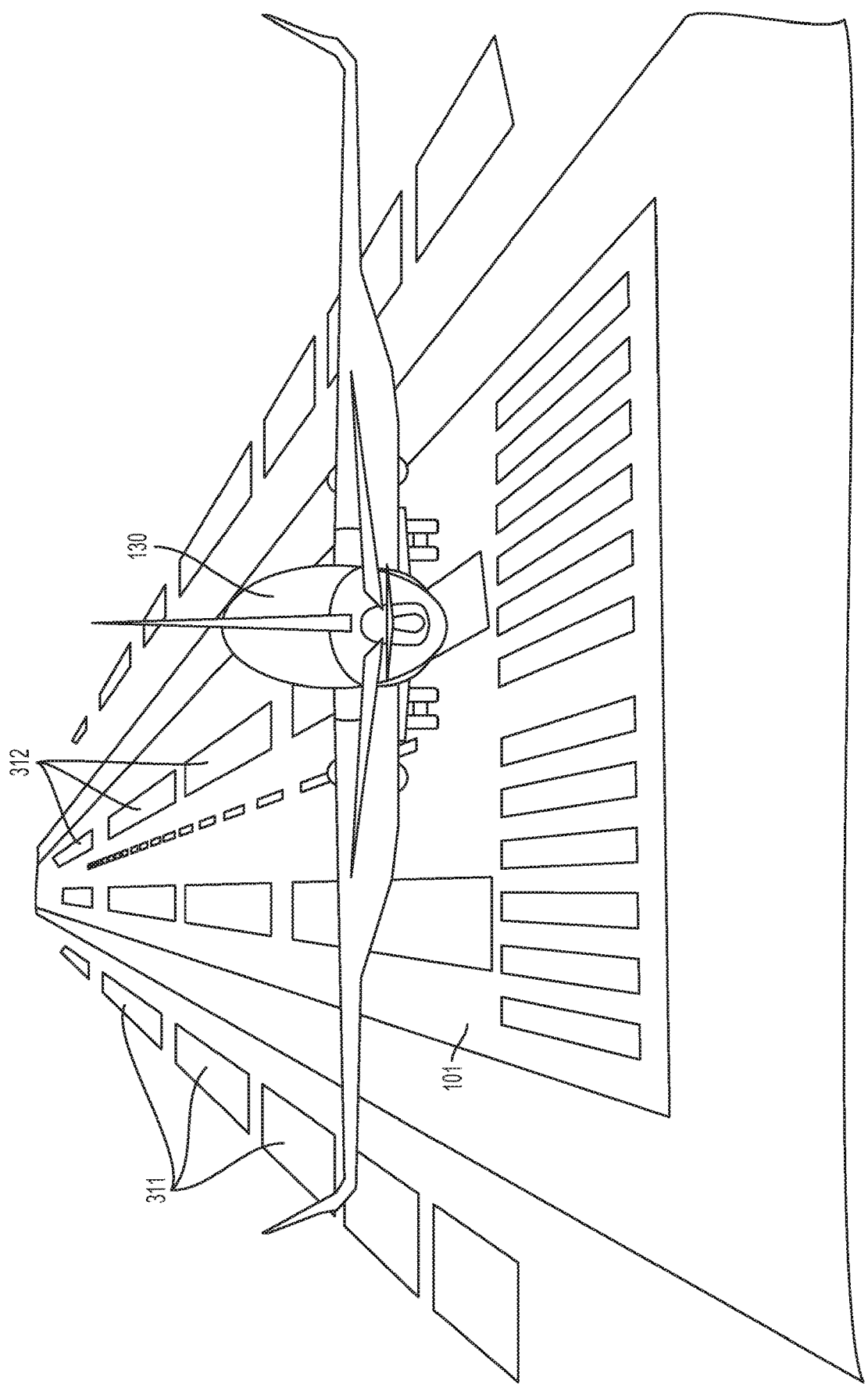
FIG. 22 illustrates a third plurality of vibration panels, according to an example implementation.

Accordingly, FIG. 22 illustrates an example wherein the system 300 includes a third plurality of vibration panels 311 positioned outside the operating surface 302 and adjacent to the runway surface 101. As with the other vibration panels discussed above, each of the vibration panels in the third plurality of vibration panels 311 may include a piezoelectric transducer 309. An air vehicle 130 is also shown in FIG. 22, approaching the runway surface 101 during a landing operation.

In some implementations, the vibration panels discussed above may be utilized for applications other than energy harvesting. For example, the first plurality of vibration panels 305 may include one or more vibration panels 312 located within the runway surface 101, as shown in FIG. 22. In some examples, the one or more vibration panels 312 and the third plurality of vibration panels 311 may be utilized in a safety application as sensors to monitor runway conditions, and may be used to detect wind turbulence at the runway surface 101, or to monitor the landing operations of an air vehicle 130.

Figure 23:
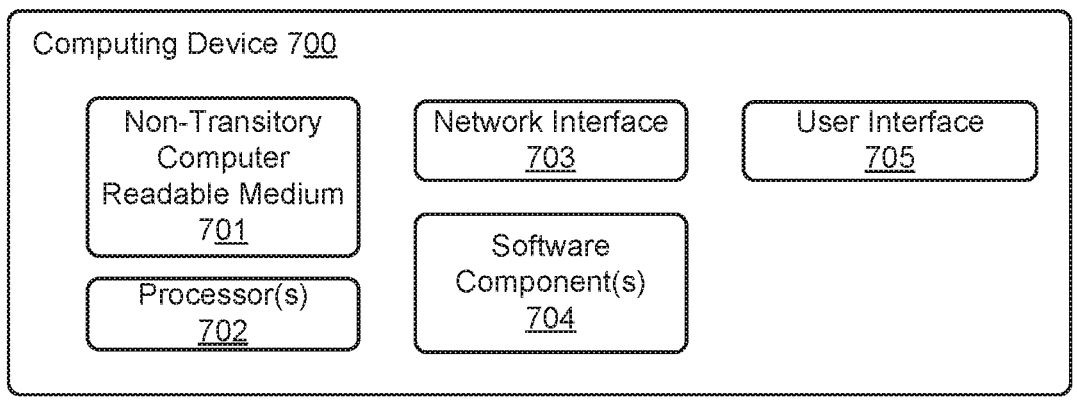
FIG. 23 illustrates an example computing device, according to an example implementation.

For instance, a computing device may be coupled to the one or more vibration panels 312. The computing device may be, for example, the computing device 700 shown in FIG. 23. The computing device 700 may include a non-transitory, computer readable medium 701 configured to store instructions that are executable by one or more processors 702. For instance, the non-transitory, computer readable medium 701 may be data storage that can be loaded with one or more of the software components 704 executable by the processor(s) 702 to achieve certain functions.

The computing device 700 may also include a network interface 703, which may be wired or wireless, and which may facilitate the communication of signals indicating detected vibrations from the one or more vibration panels 312 to the computing device 700. In this regard, the computing device 700 might not necessarily be embodied by a single device. The computing device 700 may include one or more local devices, such as a networked computer or server, or it may be composed of one or more remote devices, such as a cloud-based server or group of servers. The computing device 700 may also be a combination of local and remote devices.

Finally, the computing device 700 may include a user interface 705 for monitoring the vibrations detected by the one or more vibration panels 312, inputting commands, or outputting notifications regarding the detected vibrations.

In some implementations, the computing device 700 may be configured to detect, via the one or more vibration panels 312 coupled to the computing device 700, vibrations caused by ambient air movement at the runway surface 101. The computing device 700 may then determine, based on the detected vibrations caused by the ambient air movement, wind turbulence at the runway surface. In this way, the one or more vibration panels 312 may be used as a wind gauge, separately from or in addition to other more conventional wind gauges, to minor wind conditions at the runway surface 101.

Further, in some examples, the computing device 700 may be configured to detect, via the one or more vibration panels 312 coupled to the computing device 700, vibrations caused by a landing operation of an air vehicle 130. The computing device 700 may then determine, based on the detected vibrations caused by the landing operation of an air vehicle 130, a position of the air vehicle 130 with respect to the runway surface 101. For example, the computing device 700 may determine where on the runway surface 101 the air vehicle 130 touches down, based on which vibration panels 312 detect vibrations from the landing operation.

The ground speed of the air vehicle 130 may be determined in several ways. For instance, the computing device 700 may use an estimated ground speed that is typical of landing operations for the air vehicle in question. In other examples, the computing device 700 may receive an indication of the air vehicle's ground speed from the air vehicle 130, or perhaps the airport control tower, that bases the measure of ground speed on other sensors located on the air vehicle 130 or within the airport. Additionally or alternatively, the computing device 700 may be configured to determine, based on the detected vibrations caused by the landing operation of the air vehicle 130, a ground speed for the air vehicle 130. For example, the computing device may determine the ground speed of the air vehicle 130 by comparing the timing of vibrations between a series of adjacent vibration panels. The determined ground speed of the air vehicle 130 may change as the air vehicle 130 brakes on the runway surface 101, and thus the computing device 700 may also determine a rate of deceleration, and may further be able to determine if any slipping is occurring during the braking process, based on irregularities that may be detected in the rate of deceleration. Using this information, as well as other information, the computing device 700 may be further configured to determine a stopping distance for the air vehicle 130.

Based on the position, ground speed, and stopping distance of the air vehicle 130, and other information that may also be available, the computing device 700 may determine whether the air vehicle 130 undergoing a landing operation will be able to stop before the end of the runway surface 101. If the computing device 700 determines that the air vehicle 130 will not be able to stop before the end of the runway surface 101, the computing device 700 may generate an immediate notification to dispatch emergency services. Other implementations and applications for the vibration panels discussed herein are also possible.

Figure 24:
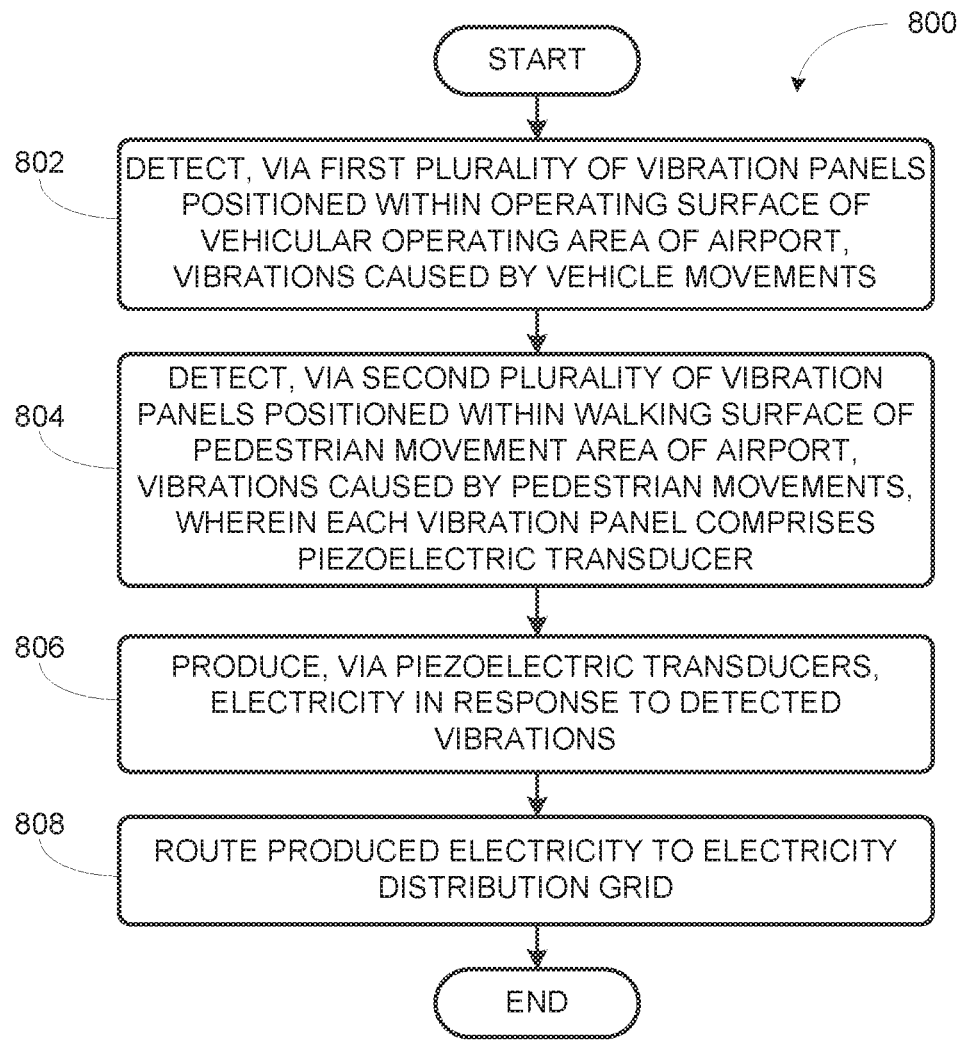
FIG. 24 shows a flowchart of an example method for harvesting energy from airport vehicle and passenger movements.

FIG. 24 shows a flowchart of an example method 800 for harvesting energy from airport vehicle and passenger movements, according to an example implementation. Method 800 shown in FIG. 24 presents an embodiment of a method that, for example, could be used with the system 300 as shown in FIGS. 17-23 and discussed herein. It should be understood that for this and other processes and methods disclosed herein, flowcharts show functionality and operation of one possible implementation of present embodiments. In this regard, each block in the flowchart may represent a module, a segment, or a portion of program code, which includes one or more instructions executable by a processor for implementing specific logical functions or steps in the process. Alternative implementations are included within the scope of the example embodiments of the present disclosure, in which functions may be executed out of order from that shown or discussed, including substantially concurrent or in reverse order, depending on the functionality involved, as would be understood by those reasonably skilled in the art.

At block 802, the method 800 includes detecting, via a first plurality of vibration panels 305 positioned within an operating surface 302 of a vehicular operating area 301 of an airport, vibrations caused by vehicle movements. In some examples, the method 800 may also include detecting, via a third plurality of vibration panels 311 positioned outside the operating surface 302 and adjacent to the runway surface 101, vibrations caused by air vehicle takeoff and landing operations.

At block 804, the method 800 includes detecting, via a second plurality of vibration panels 306 positioned within a walking surface 304 of a pedestrian movement area 303 of the airport, vibrations caused by pedestrian movements. Each vibration panel in the first plurality of vibration panels 305 and each vibration panel in the second plurality of vibration panels 306 includes a piezoelectric transducer 309. Further, each vibration panel in the third plurality of vibration panels 311 may also include a piezoelectric transducer 309.

At block 806, the method 800 includes producing, via the piezoelectric transducers 309, electricity in response to the detected vibrations. In some implementations, and discussed above, the method 800 may also include detecting, via one or more vibration panels 312 positioned within the runway surface 101, vibrations caused by ambient air movement. Based on the detected vibrations caused by the ambient air movement, the method 800 may involve determining, via a computing device 700 coupled to the one or more vibration panels 312 positioned within the runway surface 101, wind turbulence at the runway surface 101.

Further, the method 800 may include detecting, via the one or more vibration panels 312 positioned within the runway surface 101, vibrations caused by a landing operation of an air vehicle 130. Based on the detected vibrations caused by the air vehicle landing operation, the method 800 include determining, via a computing device 700 coupled to the one or more vibration panels 312 positioned within the runway surface 101, a position of the air vehicle 130 with respect to the runway surface 101, as discussed above.

Additionally, the method 800 may include determining, via the computing device 700, a ground speed for the air vehicle 130 and a stopping distance for the air vehicle 130 with respect to the runway surface 101, based on the detected vibrations caused by the landing operation of the air vehicle 130.

At block 808, the method 800 includes routing the produced electricity to an electricity distribution grid 150. In some implementations, the method 800 may involve first routing the produced electricity to a storage unit 340, such as a battery, for example. The electricity may then be routed to the electricity distribution grid 150. As discussed above, the produced electricity may be rectified, inverted, or otherwise converted as necessary depending on the particular application and routing of the produced electricity.

Figure 25:
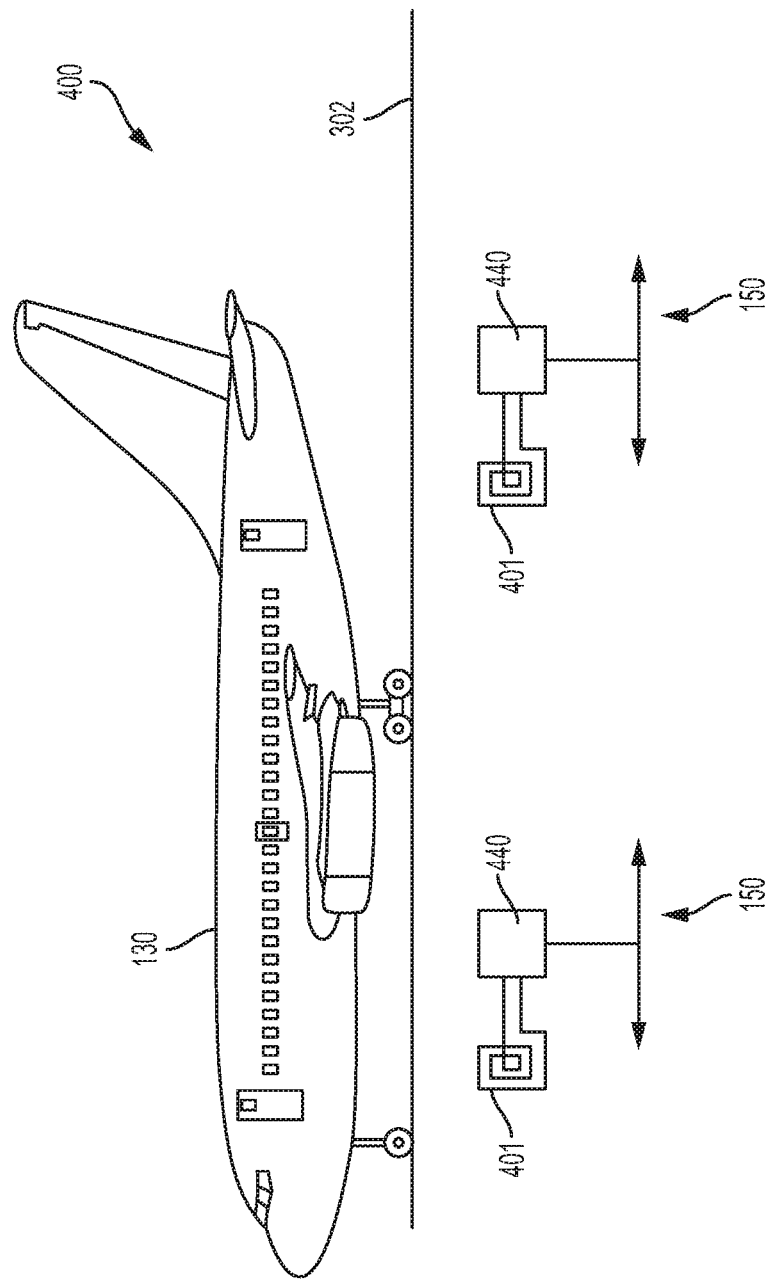
FIG. 25 illustrates an example system for harvesting energy from airport vehicle movements, according to an example implementation.

Referring now to FIG. 25, an example system 400 for harvesting energy from airport vehicle movements is shown. In particular, the system 400 may be configured to harvest energy resulting from vehicle movements over a plurality of induction loops 401. The system 400 may be implemented in an airport environment, such as the example airport shown in FIG. 17. Further, the system 400 discussed in the examples that follow may be implemented independently of, or in conjunction with, any or all of the energy harvesting components already mentioned, such as those in system 100, system 200, or system 300.

The example system 400 may include a vehicular operating area, such as the vehicular operating area 301 shown in FIG. 17. The vehicular operating area 301 may include runway surfaces 101, taxiways, and other paved areas surrounding the airport terminal where air vehicle and other airport ground vehicles may operate. The vehicular operating area 301 includes an operating surface 302, which the air vehicle and other ground vehicles make contact with as they drive about the vehicular operating area. The operating surface 302 may include, for example, a concrete or asphalt pavement section, the design of which may vary depending on a number of factors such as expected loading, climate conditions, and underlying geotechnical conditions, among others.

As shown in FIG. 25, a plurality of induction loops 401 may be positioned within the operating surface 302. Each induction loop in the plurality of induction loops 401 may include a conductive wire arranged in a loop within the operating surface 302. The passage of a metallic vehicle, such as the air vehicle 130 shown in FIG. 25, or other various ground vehicles in both airport environments and otherwise, over each induction loop in the plurality of induction loops 401 may induce an electrical current in the wire of the loop.

Further, each induction loop in the plurality of induction loops 401 may be coupled to an electricity distribution grid 150, such that electricity produced by each induction loop in response to vehicle movements over the induction loop is routed to the electricity distribution grid 150. In some implementations, each induction loop in the plurality of induction loops 401 may be coupled to a storage unit 440, such as a battery. In this arrangement, the electricity produced by each induction loop is routed to the storage unit 440, charging the battery, prior to the electricity distribution grid 150.

In some implementations, the plurality of induction loops 401 may be positioned in areas with a high volume of air vehicle and/or ground vehicle traffic, such as the gate area surrounding the terminal. Other areas having a high volume of vehicular traffic may include choke points where multiple runways and or taxiways intersect within the vehicular operating area 301. Other locations for the plurality of induction loops 401 are also possible.

Figure 26:
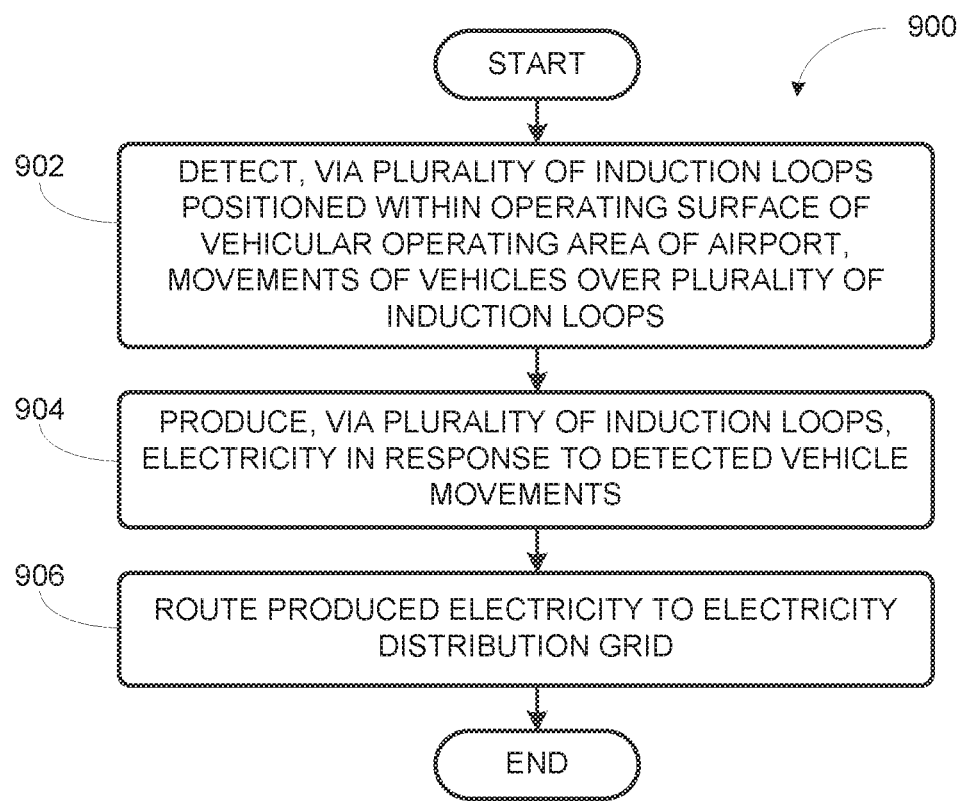
FIG. 26 shows a flowchart of an example method for harvesting energy from airport vehicle movements.

FIG. 26 shows a flowchart of an example method 900 for harvesting energy from airport vehicle and passenger movements, according to an example implementation. Method 900 shown in FIG. 26 presents an embodiment of a method that, for example, could be used with the system 400 as shown in FIG. 25 and discussed herein. It should be understood that for this and other processes and methods disclosed herein, flowcharts show functionality and operation of one possible implementation of present embodiments. In this regard, each block in the flowchart may represent a module, a segment, or a portion of program code, which includes one or more instructions executable by a processor for implementing specific logical functions or steps in the process. Alternative implementations are included within the scope of the example embodiments of the present disclosure, in which functions may be executed out of order from that shown or discussed, including substantially concurrent or in reverse order, depending on the functionality involved, as would be understood by those reasonably skilled in the art.

At block 902, the method 900 includes detecting, via a plurality of induction loops 401 positioned within the operating surface 302 of a vehicular operating area 301 of an airport, movements of vehicles over the plurality of induction loops 401.

At block 904, the method 900 includes producing, via the plurality of induction loops 401, electricity in response to the detected vehicle movements.

At block 906, the method 900 includes routing the produced electricity to an electricity distribution grid 150. In some implementations, the method 900 may involve first routing the produced electricity to a storage unit 440, such as a battery. The electricity may then be routed to the electricity distribution grid 150. As discussed above, the produced electricity may be rectified, inverted, or otherwise converted as necessary depending on the particular application and routing of the produced electricity.

The description of the different advantageous arrangements has been presented for purposes of illustration and description, and is not intended to be exhaustive or limited to the embodiments in the form disclosed. Many modifications and variations will be apparent to those of ordinary skill in the art. Further, different advantageous embodiments may describe different advantages as compared to other advantageous embodiments. The embodiment or embodiments selected are chosen and described in order to explain the principles of the embodiments, the practical application, and to enable others of ordinary skill in the art to understand the disclosure for various embodiments with various modifications as are suited to the particular use contemplated.

What is claimed is:

1. A system for harvesting energy from airport vehicle and passenger movements comprising:
   a vehicular operating area, wherein the vehicular operating area comprises an operating surface;
   a pedestrian movement area, wherein the pedestrian movement area comprises a walking surface;
   a first plurality of vibration panels positioned within the operating surface of the vehicular operating area;
   a second plurality of vibration panels positioned within the walking surface of the pedestrian movement area, wherein each vibration panel in the first plurality of vibration panels and each vibration panel in the second plurality of vibration panels comprises a piezoelectric transducer;
   wherein the piezoelectric transducer in each vibration panel in the first plurality of vibration panels includes a layer of piezoelectric crystal material positioned within a cross section of the operating surface; and
   an electricity distribution grid, wherein each piezoelectric transducer is coupled to the electricity distribution grid such that electricity produced by each piezoelectric transducer in response to vibrations from vehicle or passenger movements is routed to the electricity distribution grid.

2. The system of claim 1, wherein the vehicular operating area includes one or more of a runway surface, a taxiway, and other paved areas surrounding an airport terminal where air vehicle and other airport ground vehicles operate.

3. The system of claim 1, wherein the walking surface of the pedestrian movement area comprises a surface which pedestrians make contact with as the pedestrians move about within the pedestrian movement area.

4. The system of claim 1, wherein the piezoelectric transducer in each vibration panel in the second plurality of vibration panels includes the layer of piezoelectric crystal material positioned within the cross section of the walking surface.

5. The system of claim 1, further comprising:
   a third plurality of vibration panels positioned outside the operating surface and adjacent to a runway surface; and
   a computing device coupled to the third plurality of vibration panels, wherein the computing device is configured to: detect, via the third plurality of vibration panels, vibrations caused by ambient air movement at the runway surface.

6. The system of claim 1, further comprising:
   a third plurality of vibration panels positioned outside the operating surface and adjacent to a runway surface; and a computing device coupled to the third plurality of vibration panels, wherein the computing device is configured to:
  detect, via the third plurality of vibration panels, vibrations caused by ambient air movement at the runway surface; and
  responsively determine, based on the detected vibrations caused by the ambient air movement, wind turbulence at the runway surface.

7. The system of claim 1, further comprising:
a third plurality of vibration panels positioned outside the operating surface and adjacent to a runway surface; and
a computing device coupled to the third plurality of vibration panels, wherein the computing device is configured to:
  detect, via the third plurality of vibration panels, vibrations caused by a landing operation of an air vehicle; and
  responsively determine, based on the detected vibrations caused by the landing operation of the air vehicle, a position of the air vehicle with respect to the runway surface.

8. A method of harvesting energy from airport vehicle and passenger movements comprising:
  detecting, via a first plurality of vibration panels positioned within an operating surface of a vehicular operating area of an airport, vibrations caused by vehicle movements;
  detecting, via a second plurality of vibration panels positioned within a walking surface of a pedestrian movement area of the airport, vibrations caused by pedestrian movements, wherein each vibration panel in the first plurality of vibration panels and each vibration panel in the second plurality of vibration panels comprises a piezoelectric transducer, wherein the piezoelectric transducer in each vibration panel in the first plurality of vibration panels includes a layer of piezoelectric crystal material positioned within a cross section of the operating surface;
  producing, via the piezoelectric transducers, electricity in response to the detected vibrations; and
  routing the produced electricity to an electricity distribution grid.

9. The method of claim 8, wherein the piezoelectric transducer in each vibration panel in the second plurality of vibration panels includes the layer of piezoelectric crystal material positioned within the cross section of the walking surface.

10. The method of claim 8, wherein the operating surface comprises a runway surface for air vehicle takeoff and landing, the method further comprising:
  detecting, via a third plurality of vibration panels positioned outside the operating surface and adjacent to the runway surface, vibrations caused by an air pressure wave from air vehicle takeoff or landing.

11. The method of claim 8, wherein the operating surface comprises a runway surface for air vehicle takeoff and landing, and wherein the first plurality of vibration panels comprises one or more vibration panels positioned within the runway surface, the method further comprising:
  detecting, via the one or more vibration panels positioned within the runway surface, vibrations caused by ambient air movement; and
  based on the detected vibrations caused by the ambient air movement, determining, via a computing device coupled to the one or more vibration panels positioned within the runway surface, wind turbulence at the runway surface.

12. The method of claim 8, wherein the operating surface comprises a runway surface for air vehicle takeoff and landing, and wherein the first plurality of vibration panels comprises one or more vibration panels positioned within the runway surface, the method further comprising:
  detecting, via the one or more vibration panels positioned within the runway surface, vibrations caused by a landing operation of an air vehicle; and
  based on the detected vibrations caused by the air vehicle landing operation, determining, via a computing device coupled to the one or more vibration panels positioned within the runway surface, a position of the air vehicle with respect to the runway surface.

13. The method of claim 8, wherein detecting, via the first plurality of vibration panels positioned within the operating surface of the vehicular operating area of an airport, vibrations caused by vehicle movements comprises detecting the vibrations caused by the vehicle movements over one or more of a runway surface, a taxiway, and other paved areas surrounding an airport terminal where air vehicle and other airport ground vehicles operate.

14. The method of claim 8, wherein detecting, via the second plurality of vibration panels positioned within the walking surface of the pedestrian movement area of the airport, vibrations caused by pedestrian movements comprises detecting the vibrations caused by the pedestrian movements over a surface which pedestrians make contact with as the pedestrians move about within the pedestrian movement area.

15. A system for harvesting energy from airport vehicle movements comprising:
  a vehicular operating area, wherein the vehicular operating area comprises an operating surface;
  a plurality of induction loops positioned within a cross section of the operating surface of the vehicular operating area, wherein each induction loop in the plurality of induction loops includes a conductive wire arranged in a loop within the operating surface; and
  an electricity distribution grid, wherein the plurality of induction loops is coupled to the electricity distribution grid such that electricity produced by the plurality of induction loops in response to vehicle movements over the operating surface of the vehicular operating area is routed to the electricity distribution grid, wherein the vehicle movements induce an electrical current in the conductive wire of each induction loop.

16. The system of claim 15, further comprising:
a storage unit, wherein the produced electricity is routed to the storage unit prior to routing the produced electricity to the electricity distribution grid.

17. The system of claim 15, further comprising:
a plurality of vibration panels positioned within the operating surface of the vehicular operating area of the airport, wherein each vibration panel in the plurality of vibration panels comprises a piezoelectric transducer, wherein each piezoelectric transducer is coupled to the electricity distribution grid such that electricity produced by each piezoelectric transducer in response to vibrations from vehicle or passenger movements is routed to the electricity distribution grid.

18. A method of harvesting energy from airport vehicle movements comprising:
  detecting, via a plurality of induction loops positioned within a cross section of an operating surface of a vehicular operating area of an airport, movements of vehicles over the plurality of induction loops, wherein each induction loop in the plurality of induction loops includes a conductive wire arranged in a loop within the operating surface;

producing, via the plurality of induction loops, electricity in response to the detected vehicle movements, wherein the vehicle movements induce an electrical current in the conductive wire of each induction loop; and routing the produced electricity to an electricity distribution grid.

19. The method of claim 18, wherein, before routing the produced electricity to the electricity distribution grid, the electricity is routed to a storage unit.

20. The method of claim 18, further comprising:

detecting, via a plurality of vibration panels positioned within the operating surface of the vehicular operating area of the airport, vibrations caused by vehicle movements, wherein each vibration panel in the plurality of vibration panels comprises a piezoelectric transducer;

producing, via the piezoelectric transducers, electricity in response to the detected vibrations; and routing the produced electricity to the electricity distribution grid.

* * * * *